United States Patent
Senda et al.

(10) Patent No.: US 10,485,100 B2
(45) Date of Patent: Nov. 19, 2019

(54) CIRCUIT BOARD AND DISPLAY SYSTEM

(71) Applicant: Semiconductor Energy Laboratory Co., Ltd., Atsugi-shi, Kanagawa-ken (JP)

(72) Inventors: Naoyuki Senda, Kyoto (JP); Yuichi Yanagisawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 100 days.

(21) Appl. No.: 15/275,612

(22) Filed: Sep. 26, 2016

(65) Prior Publication Data

US 2017/0092224 A1    Mar. 30, 2017

(30) Foreign Application Priority Data

Sep. 30, 2015   (JP) .................................. 2015-194752
Jan. 29, 2016   (JP) .................................. 2016-016118

(51) Int. Cl.
| | |
|---|---|
| H05K 1/02 | (2006.01) |
| G06F 1/16 | (2006.01) |
| H01F 7/06 | (2006.01) |
| G06F 3/147 | (2006.01) |
| H05K 1/05 | (2006.01) |
| H05K 1/16 | (2006.01) |

(52) U.S. Cl.
CPC ........... *H05K 1/028* (2013.01); *G06F 1/1652* (2013.01); *H05K 1/0268* (2013.01); *G06F 3/147* (2013.01); *G09G 2354/00* (2013.01); *G09G 2380/02* (2013.01); *H01F 2007/068* (2013.01); *H05K 1/05* (2013.01); *H05K 1/165* (2013.01); *H05K 2201/0116* (2013.01); *H05K 2201/0133* (2013.01); *H05K 2201/0162* (2013.01); *H05K 2201/057* (2013.01); *H05K 2201/086* (2013.01); *H05K 2201/10128* (2013.01)

(58) Field of Classification Search
CPC ...................................................... G09G 5/0003
USPC ......................................................... 361/749
See application file for complete search history.

(56) References Cited

U.S. PATENT DOCUMENTS

| | | | |
|---|---|---|---|
| 6,483,484 B1 | 11/2002 | Yamazaki et al. |
| 6,791,462 B2 | 9/2004 | Choi |
| 7,138,922 B2 | 11/2006 | Strumolo et al. |
| 7,598,927 B2 | 10/2009 | Yamazaki et al. |
| 8,890,187 B2 | 11/2014 | Arasawa |
| 9,111,841 B2 | 8/2015 | Yamazaki et al. |
| (Continued) | | |

FOREIGN PATENT DOCUMENTS

| | | |
|---|---|---|
| JP | 10-026754 A | 1/1998 |
| JP | 2009-222844 A | 10/2009 |
| (Continued) | | |

*Primary Examiner* — Stanley Tso
(74) *Attorney, Agent, or Firm* — Robinson Intellectual Property Law Office; Eric J. Robinson

(57) ABSTRACT

To provide a circuit board in which a curvature of a display surface can be controlled, or to provide a highly portable circuit board. A circuit board includes a substrate with flexibility and a curvature control mechanism. The curvature control mechanism includes a first electromagnet and a second electromagnet provided over a first surface of the substrate, an insulating film provided over the first and second electromagnets, and wirings electrically connected to the first and second electromagnets.

18 Claims, 21 Drawing Sheets

(56) References Cited

U.S. PATENT DOCUMENTS

| | | |
|---|---|---|
| 2009/0121882 A1 | 5/2009 | Al-Mutairi |
| 2010/0295827 A1* | 11/2010 | Lim .......................... G09G 3/20 |
| | | 345/204 |
| 2013/0264549 A1 | 10/2013 | Yamazaki et al. |
| 2013/0300313 A1 | 11/2013 | Yamazaki et al. |
| 2014/0118910 A1* | 5/2014 | Sung ....................... G09F 9/301 |
| | | 361/679.01 |
| 2015/0035812 A1 | 2/2015 | Shin et al. |
| 2015/0109201 A1 | 4/2015 | Yamazaki et al. |
| 2015/0145755 A1 | 5/2015 | Yamazaki et al. |
| 2015/0146352 A1 | 5/2015 | Yanagisawa et al. |
| 2015/0177789 A1 | 6/2015 | Jinbo |
| 2015/0301636 A1 | 10/2015 | Akimoto et al. |
| 2015/0316958 A1 | 11/2015 | Takesue |
| 2016/0035310 A1* | 2/2016 | Song ....................... G06F 3/017 |
| | | 345/156 |
| 2016/0118616 A1 | 4/2016 | Hiroki et al. |
| 2016/0154435 A1 | 6/2016 | Yanagisawa |
| 2016/0270764 A1* | 9/2016 | Wodecki ................ A61B 8/462 |
| 2018/0137801 A1* | 5/2018 | An .......................... G06F 3/01 |

FOREIGN PATENT DOCUMENTS

| | | |
|---|---|---|
| JP | 2011/238908 | 11/2011 |
| JP | 2015-031948 A | 2/2015 |
| WO | WO-2004/003630 | 1/2004 |

\* cited by examiner

FIG. 1A
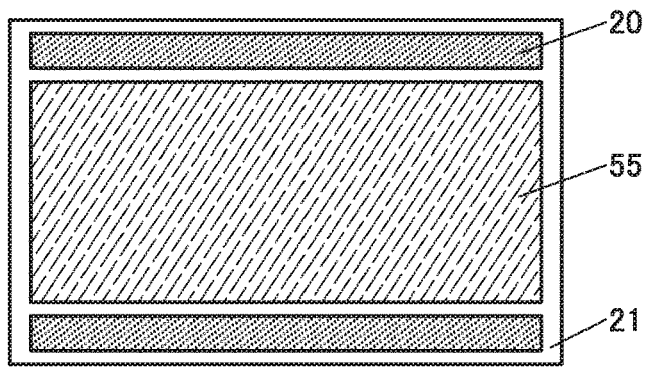
FIG. 1B
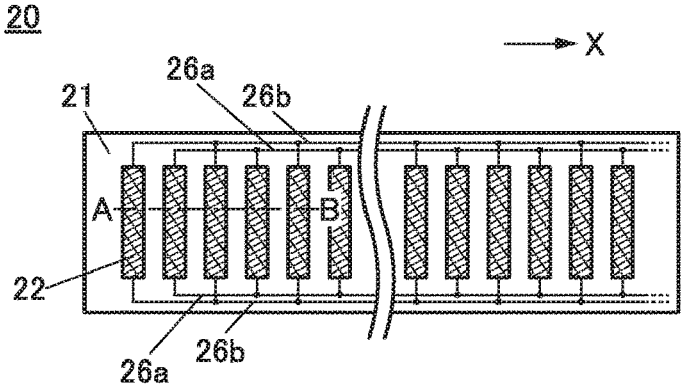
FIG. 1C1
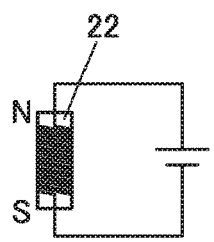
FIG. 1C2
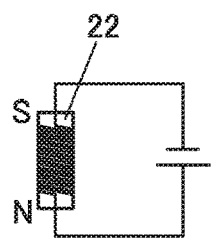
FIG. 1D
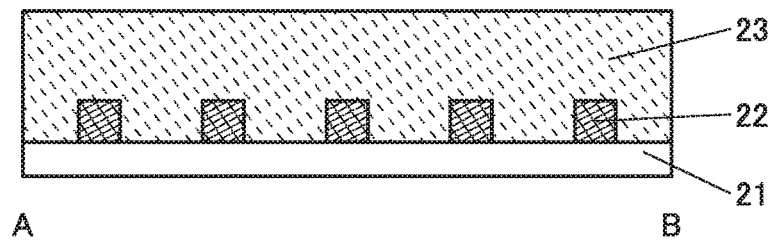

FIG. 2A
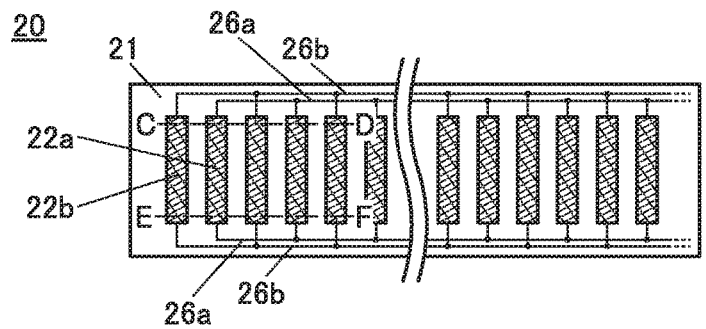
FIG. 2B1
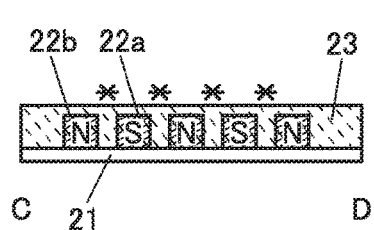
FIG. 2B2
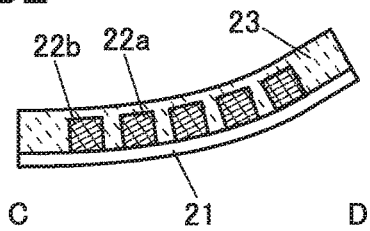
FIG. 2C1
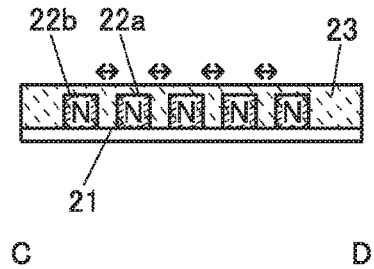
FIG. 2C2
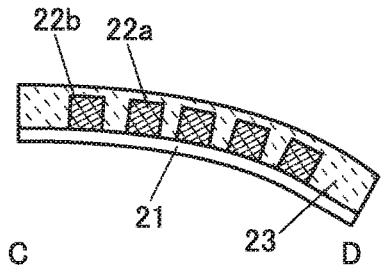

FIG. 4A
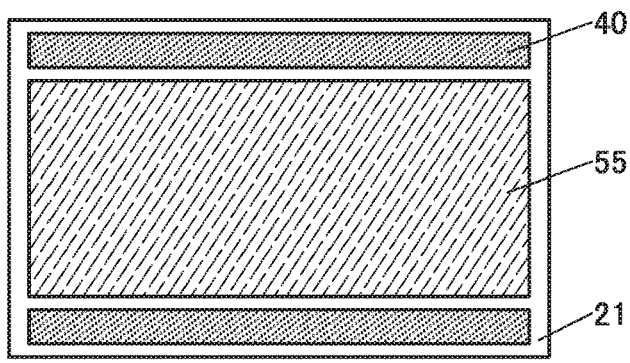
FIG. 4B1
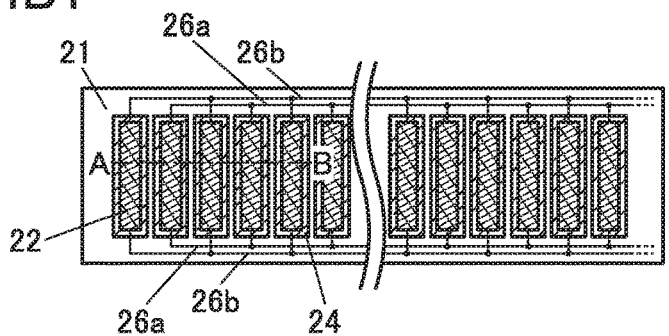
FIG. 4B2
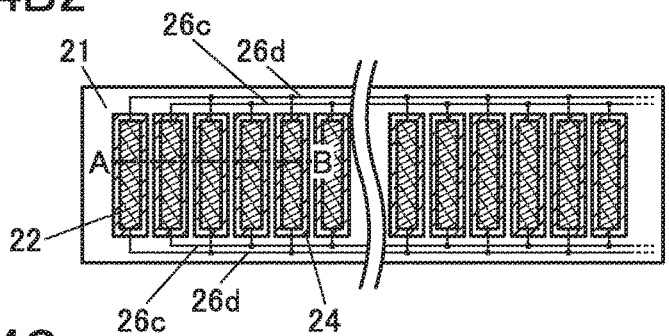
FIG. 4C
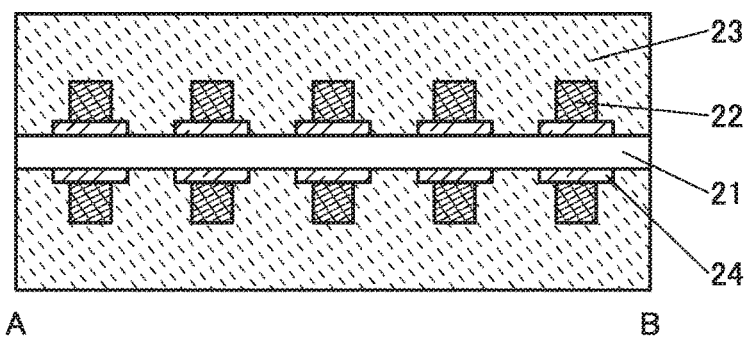

FIG. 5A
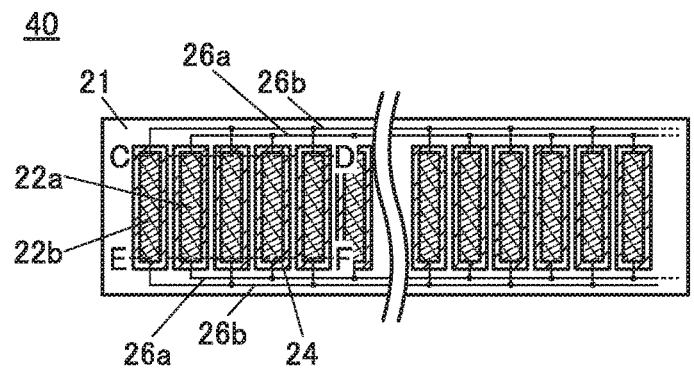
FIG. 5B1
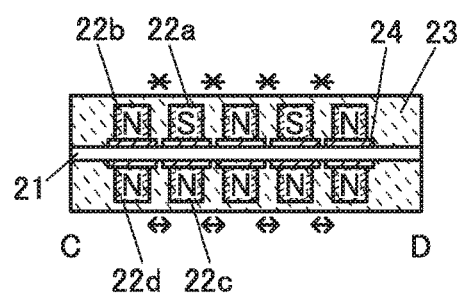
FIG. 5B2
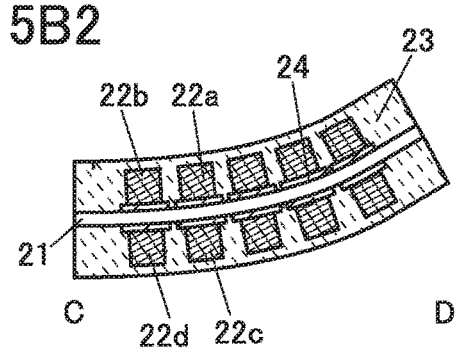
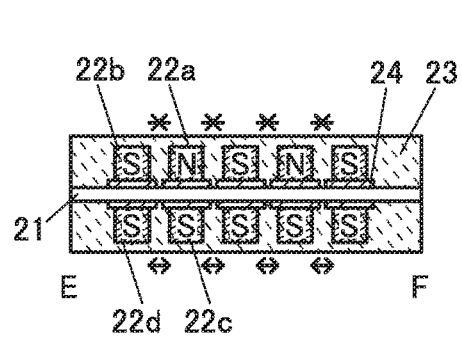
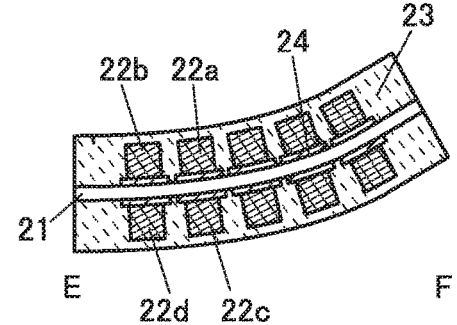

FIG. 6A1
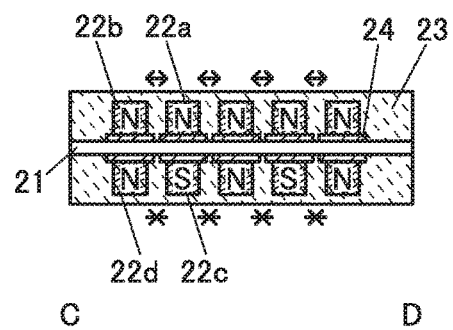
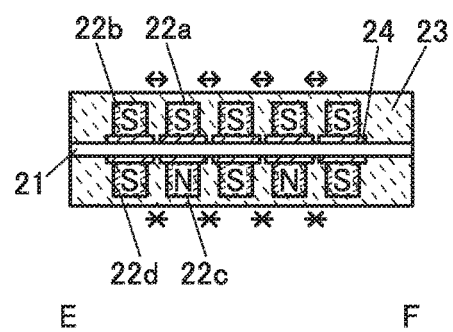
FIG. 6A2
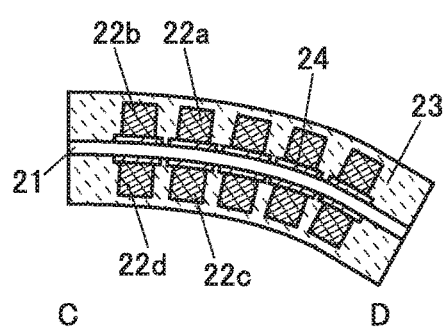
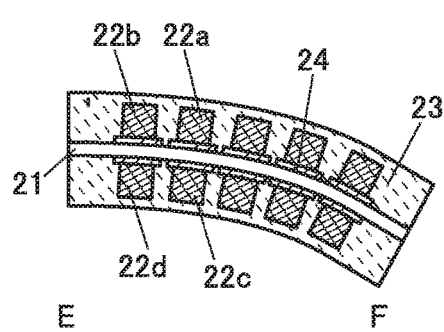
FIG. 6B1
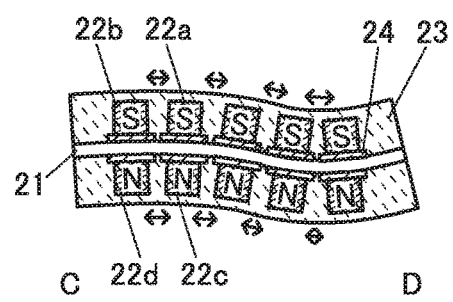
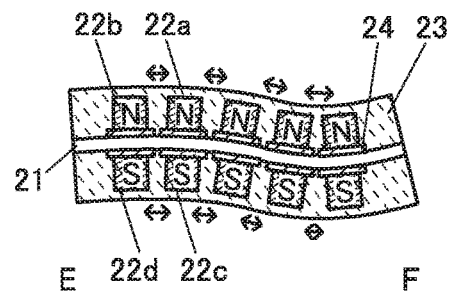
FIG. 6B2
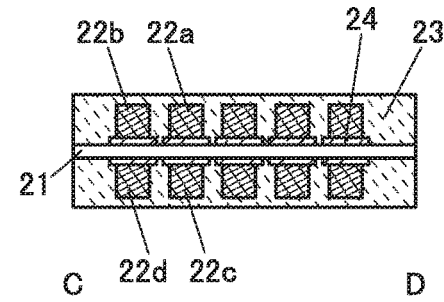
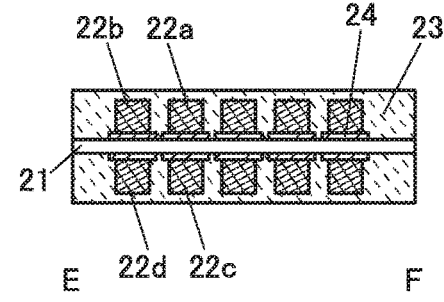

FIG. 9A
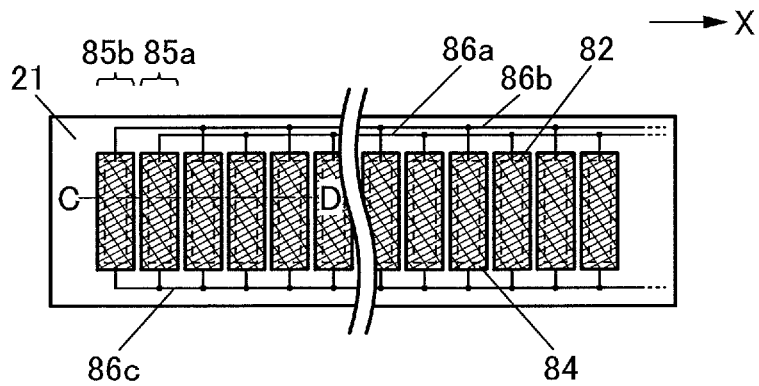
FIG. 9B1
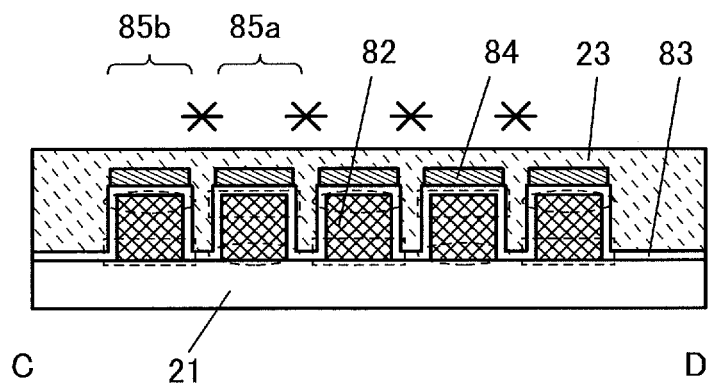
FIG. 9B2
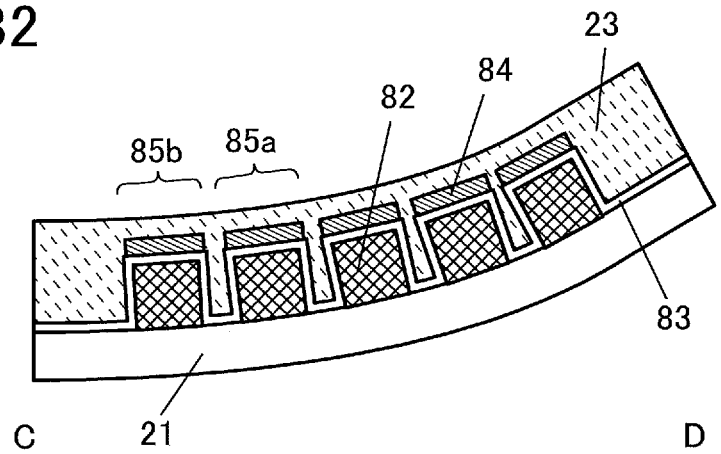

FIG. 10A1
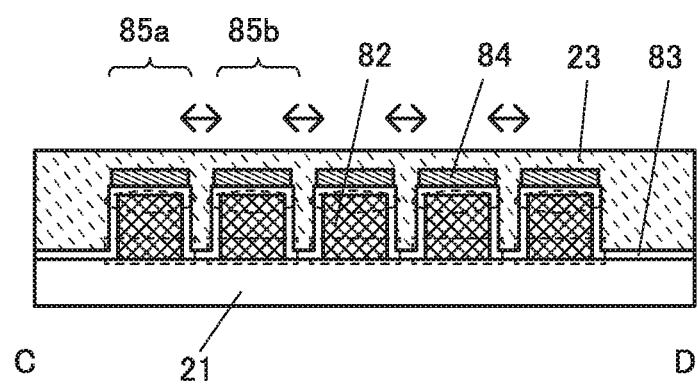
FIG. 10A2
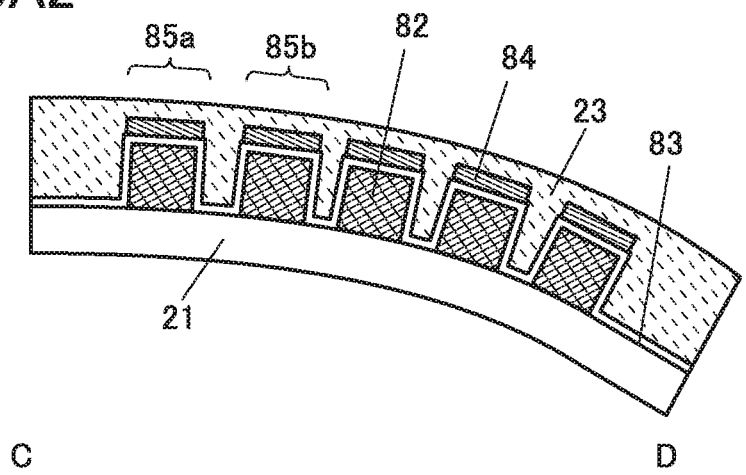

CIRCUIT BOARD AND DISPLAY SYSTEM

BACKGROUND OF THE INVENTION

1. Field of the Invention

One embodiment of the present invention relates to a circuit board. Another embodiment of the present invention relates to a display device. Another embodiment of the present invention relates to an electronic device. Another embodiment of the present invention relates to a display system.

Note that a circuit board in this specification means a general board that includes a circuit including wirings (e.g., a semiconductor device and a display device). In addition, a semiconductor device means a general device that can operate by utilizing semiconductor characteristics. Moreover, in this specification and the like, a display system means a general system including a display device. The display system may include a semiconductor device such as a transistor, an arithmetic device, a memory device, an imaging device, and the like, in addition to a display device.

2. Description of the Related Art

Display devices in which the curvature of a display surface is changed have been developed because such devices are considered to have the potential for having the function of enhancing a stereoscopic effect or the realistic sensation of a display image. As the display device in which the curvature of a display surface is changed continuously, Patent Document 1 is known, for example. In Patent Document 1, the curvature of a display surface is controlled by fixing two nuts with a screw shaft passing therethrough on a display panel and rotating the screw shaft. Moreover, a method is also known in which a slit is provided on the back of the housing of a display device and a mechanism which is provided across the slit changes the width of the slit controls the curvature of a display surface (Patent Document 2).

REFERENCE

Patent Document

[Patent Document 1] Japanese Published Patent Application No. H10-026754
[Patent Document 2] United States Patent Application Publication No. 2015/0035812

SUMMARY OF THE INVENTION

However, the display devices in Patent Document 1 and Patent Document 2 are stationary and the size, weight, or the like of the mechanism controlling the curvature of a display surface is not considered. Furthermore, it is required to reduce the volume and the weight of mobile display devices like smartphones or tablet devices. It is difficult to apply these mechanisms in forming mobile display devices in which the curvature of a display surface is controlled.

An object of one embodiment of the present invention is to provide a circuit board, a display device, an electronic device, or a display system in which the curvature of a display surface can be controlled. Another object of one embodiment of the present invention is to provide a lightweight circuit board, a lightweight display device, a lightweight electronic device, or a lightweight display system. Another object of one embodiment of the present invention is to provide a highly portable circuit board, a highly portable display device, a highly portable electronic device, or a highly portable display system. Another object of one embodiment of the present invention is to provide a novel circuit board, a novel display device, a novel electronic device, or a novel display system.

Note that the descriptions of these objects do not disturb the existence of other objects. In one embodiment of the present invention, there is no need to achieve all the objects. Other objects will be apparent from and can be derived from the description of the specification, the drawings, the claims, and the like.

An embodiment of the present invention is a circuit board including a substrate and a curvature control mechanism. The curvature control mechanism includes a first electromagnet, a second electromagnet, an insulating film, and wirings. The substrate has flexibility. The first electromagnet and the second electromagnet are provided over a first surface of the substrate. The first electromagnet is provided so that a line connecting one magnetic pole and the other magnetic pole of the first electromagnet and a line parallel to a longitudinal direction of the substrate cross each other perpendicularly. The second electromagnet is provided so that a line connecting one magnetic pole and the other magnetic pole of the second electromagnet and the line parallel to the longitudinal direction of the substrate cross each other perpendicularly. The first electromagnet is provided so that a center axis of the first electromagnet is parallel to a center axis of the second electromagnet. The first electromagnet is provided so that a line connecting one magnetic pole of the first electromagnet and one magnetic pole of the second electromagnet and a line connecting the other magnetic pole of the first electromagnet and the other magnetic pole of the second electromagnet are parallel to the longitudinal direction of the substrate. The insulating film is provided over the substrate, the first electromagnet, and the second electromagnet. The wirings are electrically connected to the first electromagnet and the second electromagnet.

Furthermore, the circuit board in which the curvature control mechanism has a function of controlling a curvature of the substrate is also an embodiment of the present invention.

An embodiment of the present invention is a display device including the circuit board and a display portion. The display portion has a function of displaying an image. The display portion is provided in a region not overlapping with the first electromagnet and the second electromagnet.

Furthermore, a display device including the circuit board and a display portion, in which the display portion has a function of displaying an image and the display portion is provided in a region overlapping with the first electromagnet and the second electromagnet is also an embodiment of the present invention.

An embodiment of the present invention is an electronic device including the display device and a first control circuit. The first control circuit includes a display control circuit and a curvature control circuit. The display control circuit has a function of controlling image display of the display portion. The curvature control circuit has a function of controlling operation of the curvature control mechanism.

An embodiment of the present invention is a display system including the display device, a first control circuit, and a distance data detection sensor. The first control circuit includes the display control circuit and the curvature control circuit. The display control circuit has a function of controlling image display of the display portion. The distance data detection sensor has a function of sensing distance data between a user and the distance data detection sensor and a function of outputting the distance data to the curvature control circuit. The curvature control circuit has a function of controlling operation of the curvature control mechanism on the basis of the distance data.

Furthermore, the display system in which the distance data detection sensor includes an infrared ray sensor or an ultrasonic wave sensor is also an embodiment of the present invention.

Furthermore, a display system including the display device, a second control circuit, a positional data detection sensor, and a distance data detection mechanism is also an embodiment of the present invention. The second control circuit includes a display control circuit, a curvature control circuit, and a movable portion control circuit. The display control circuit has a function of controlling image display of the display portion. The distance data detection mechanism includes a distance data detection sensor and a movable portion. The distance data detection sensor is connected to the movable portion. The positional data detection sensor has a function of sensing positional data of a user and a function of outputting the positional data to the movable portion control circuit. The movable portion control circuit has a function of controlling a detection range in which the distance data detection sensor detects the user by controlling operation of the movable portion on the basis of the positional data. The distance data detection sensor has a function of sensing the distance data between the user and the distance data detection sensor and a function of outputting the distance data to the curvature control circuit. The curvature control circuit has a function of controlling operation of the curvature control mechanism on the basis of the distance data.

Furthermore, the display system in which the distance data detection sensor includes an infrared ray sensor or an ultrasonic wave sensor is also an embodiment of the present invention.

Furthermore, the display system in which the positional data detection sensor includes a CCD sensor or a CMOS sensor is also an embodiment of the present invention.

According to an embodiment of the present invention, a circuit board, a display device, an electronic device, or a display system in which the curvature of a display surface can be controlled can be provided. Alternatively, according to an embodiment of the present invention, a lightweight circuit board, a lightweight display device, a lightweight electronic device, or a lightweight display system can be provided. Alternatively, according to an embodiment of the present invention, a highly portable circuit board, a highly portable display device, a highly portable electronic device, or a highly portable display system can be provided. Alternatively, according to an embodiment of the present invention, a novel circuit board, a novel display device, a novel electronic device, or a novel display system can be provided.

Note that the descriptions of these effects do not disturb the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

In the accompanying drawings:

FIGS. 1A, 1B, 1C1, 1C2, and 1D illustrate a structure of a display device of an embodiment;

FIGS. 2A, 2B1, 2B2, 2C1, and 2C2 each illustrate a driving method of a curvature control mechanism of an embodiment;

FIGS. 4A, 4B1, 4B2, and 4C illustrate a structure of a display device of an embodiment;

FIGS. 5A, 5B1, and 5B2 illustrate a driving method of a curvature control mechanism of an embodiment;

FIGS. 6A1, 6A2, 6B1, and 6B2 each illustrate a driving method of the curvature control mechanism of an embodiment;

FIGS. 9A, 9B1, and 9B2 illustrate a driving method of the curvature control mechanism of an embodiment;

FIGS. 10A1 and 10A2 illustrate a driving method of the curvature control mechanism of an embodiment;

DETAILED DESCRIPTION OF THE INVENTION

Figure 3A:
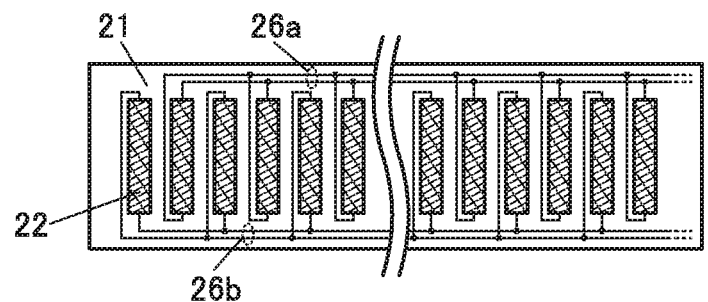
FIGS. 3A to 3C illustrate structures of the curvature control mechanism of an embodiment.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and description thereof will not be repeated.

In the drawings, the size, the thickness of layers, or regions may be exaggerated for clarity. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and description thereof will not be repeated. Furthermore, the same hatching pattern is used for portions having similar functions, and the portions are not especially denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not the same as those which specify one embodiment of the present invention in some cases.

In this specification and the like, the terms for describing arrangement, such as "over" and "under", are used for convenience to describe the positional relation between components with reference to drawings. Furthermore, the positional relation between components is changed as appropriate in accordance with the direction in which the components are described. Thus, the positional relation is not limited to that described with a term used in this specification and can be described with another term as appropriate depending on the situation.

In this specification and the like, a transistor means an element having at least three terminals including a gate, a drain, and a source. The transistor has a channel region between the drain (a drain terminal, a drain region, or a drain electrode) and the source (a source terminal, a source region, or a source electrode), and a current can flow through the drain, the channel region, and the source. Note that in this specification and the like, a channel region means a region through which a current mainly flows.

Furthermore, functions of the source and the drain might be switched when a transistor having different polarity is employed or a direction of a current flow is changed in circuit operation, for example. Therefore, the terms "source" and "drain" can be switched in this specification and the like.

In this specification and the like, the terms "film" and "layer" can be switched with each other. For example, the term "conductive layer" can be changed to the term "conductive film" in some cases. Also, the term "insulating film" can be changed to the term "insulating layer" in some cases.

Note that in this specification and the like, the term "parallel" means that the angle formed between two straight lines is greater than or equal to −10° and less than or equal to 10°. Thus, the case where the angle is greater than or equal to −5° and less than or equal to 5° is also included. In addition, the term "perpendicular" means that the angle formed between two straight lines is greater than or equal to 80° and less than or equal to 100°. Thus, the case where the angle is greater than or equal to 85° and less than or equal to 95° is also included.

Embodiment 1

In this embodiment, a structure of a display device of one embodiment of the present invention is described with reference to FIGS. 1A, 1B, 1C1, 1C2, and 1D, FIGS. 2A, 2B1, 2B2, 2C1, and 2C2, FIGS. 3A to 3C, FIGS. 4A, 4B1, 4B2, and 4C, FIGS. 5A, 5B1, and 5B2, and FIGS. 6A1, 6A2, 6B1, and 6B2.

Structure Example 1 of Display Device

FIG. 1A is a top view of a display device 10. The display device 10 includes a substrate 21, a display portion 55, and curvature control mechanisms 20. The display portion 55 has a function of displaying an image. The display portion 55 includes a display element like a liquid crystal element, an EL (Electro Luminescence) element, or an electrophoretic element, for example.

The display portion 55 and the curvature control mechanisms 20 are provided over a first surface of the substrate 21. The curvature control mechanisms 20 are provided over a region of the display device 10 not overlapping with the display portion 55. The curvature control mechanisms 20 are provided, for example, in a vicinity of an end portion of the display device 10 so as to extend along a long side of the display device 10. FIG. 1A shows an example where the two curvature control mechanisms 20 are provided between the display portion 55 and two long sides of the display device 10. Note that the curvature control mechanisms 20 may overlap with the display portion 55.

Although this embodiment shows an example where the display portion and the curvature control mechanisms are provided over the same substrate, one embodiment of the present invention is not limited to this example. The display portion may be provided over a first substrate, the curvature control mechanisms may be provided over a second substrate, and the first substrate and the second substrate may be bonded to each other. Alternatively, the display portion may be provided over the first substrate, the curvature control mechanisms may be provided over the second substrate, and at least parts of the first substrate and the second substrate may be wrapped by a flexible housing or the like so that the first substrate and the second substrate can be bent as the curvature of the second substrate generally matches that of the first substrate.

FIG. 1B shows an enlarged top view of components of the curvature control mechanism 20. The curvature control mechanism 20 includes electromagnets 22 and wirings 26a and 26b. The curvature control mechanism 20 can be referred to as a circuit board. Furthermore, the curvature control mechanism 20 is included in a circuit board.

When a current is applied to the electromagnets 22, magnetic poles appear on both ends of each of the electromagnets 22. Specifically, one magnetic pole becomes one of the north pole and the south pole and the other magnetic pole becomes the other thereof when a current is applied to the electromagnet 22. The polarity (direction) of the magnetic poles on both ends can be reversed by switching the direction of the current applied (see FIGS. 1C1 and 1C2). The electromagnets 22 can be referred to as current-control-type electromagnets.

The electromagnets 22 are provided over the substrate 21 so that two lines cross each other perpendicularly; one line (hereinafter, also referred to as a center axis) connects the center of one magnetic pole of one of the electromagnets 22 and the center of the other magnetic pole of the electromagnet 22, and the other line (hereinafter, also referred to as an extended axis) is parallel to the longitudinal direction of the curvature control mechanism 20 (the X direction in FIG. 1B). In addition, the electromagnets 22 are provided so that the center axes are parallel with each other and a line connecting the magnetic poles on one side of the electromagnets 22 and a line connecting the magnetic poles on the other side of the electromagnets 22 are parallel with the extended axis of the curvature control mechanism 20.

Note that FIG. 1B shows an example where the electromagnets 22 are provided at regular intervals. With such a structure, the curvature of the display device 10 or the substrate 21 controlled by the curvature control mechanism 20 can be uniform. Furthermore, the curvature of the display device 10 or the substrate 21 in a specific region can be larger (or smaller) than the other regions by providing a plurality of electromagnets 22 in the specific region at short (or long) intervals.

The electromagnets 22 are each electrically connected to one of the wirings 26a and 26b. Specifically, the wiring connected to one electromagnet 22 is different from that connected to an adjacent electromagnet 22 (see FIG. 1B).

The wiring 26a and the wiring 26b are electrically connected to a power source (not illustrated). The power source has a function of outputting a current to the wirings 26a and 26b after determining the amount and the direction of the current for each of the wirings. The power source may be provided inside or outside the display device 10.

FIG. 1D is a cross-sectional view taken along dashed-dotted line A-B in FIG. 1B. The electromagnets 22 are provided over the first surface of the substrate 21, and an insulating film 23 is provided over the substrate 21 and the electromagnets 22. The electromagnets 22 are fixed to the substrate 21. Furthermore, the insulating film 23 is in close contact with the substrate 21 and the electromagnets 22, and the insulating film 23 fills a region between two adjacent electromagnets 22 entirely. The insulating film 23 functions as a protective film of the substrate 21 and the electromagnets 22.

The substrate 21 has flexibility. As the substrate 21, a material that is thin enough to have flexibility such as glass, quartz, a resin, a metal, an alloy, or a semiconductor can be used. Furthermore, the substrate 21 preferably has a property of returning to its original shape when bending or pulling is stopped. Note that when a conductive material such as metal or alloy is used as the substrate 21, an insulating film is provided between the substrate 21 and the electromagnets 22.

As the electromagnets 22, a magnetic material, around which a conductive wiring is wound spirally or cylindrically, can be used. As the magnetic material, a soft magnetic substance having high magnetic permeability such as iron or Permalloy (an alloy containing iron and nickel mainly) is preferable. Soft magnetism is a property of a material that is magnetized by a magnetic field to lose its magnetism when away from the magnetic field. Furthermore, copper can be used as the conductive wiring.

Note that the strength of the magnetic poles generated in the electromagnets 22 can be adjusted by the number of windings of the conductive wiring around the magnetic material and the amount of the current applied to the electromagnets 22. Furthermore, the strength of the magnetic poles can be adjusted also by using a magnetic material having different magnetic permeability.

As the insulating film 23, a material with high elasticity such as a synthetic rubber material or a natural rubber material can be used. As a synthetic rubber material, for example, fluorine rubber, silicone rubber, chloroprene rubber, nitrile-butadiene rubber, ethylene-propylene rubber, styrene-butadiene rubber, and the like can be given. Furthermore, foam rubber including a plurality of foams inside the material (also referred to as porous rubber) may be used. Among foam rubbers, open-cell foam rubber, in which a plurality of foams are connected so that a cavity is formed, is preferably used. As open-cell foam rubber, chloroprene sponge, silicone sponge, or the like can be given.

Driving Method Example 1 of Curvature Control Mechanism

Next, a driving method of the curvature control mechanism 20 is described. In the curvature control mechanism 20 in FIG. 2A, the electromagnet electrically connected to the wiring 26a is referred to as the electromagnet 22a and the electromagnet electrically connected to the wiring 26b is referred to as the electromagnet 22b. In this driving method example, the electromagnet 22 means both the electromagnets 22a and 22b.

FIG. 2B1 shows cross-sectional schematic views of the curvature control mechanism 20 at the moment of the application of a current to the electromagnets 22a and 22b. FIG. 2B2 shows cross-sectional schematic views of the curvature control mechanism 20 in a state where a change in shape converges after a certain period from the application of the current. FIGS. 2B1 and 2B2 are each the cross-sectional views taken along dashed-dotted lines C-D and E-F in FIG. 2A. Furthermore, the dash-dotted line C-D passes through the magnetic poles on one side of the electromagnets 22 and the dash-dotted line E-F passes through the magnetic poles on the other side of the electromagnets 22.

The directions of the magnetic poles on one and the other sides of one electromagnet 22 are opposite from those of an adjacent electromagnet 22 as a result of the application of currents in the reverse directions to the electromagnets 22a and 22b. Therefore, magnetic attraction is generated between two adjacent electromagnets 22 (see FIG. 2B1). Since the electromagnets 22 are fixed to the substrate 21, the substrate 21 curves upward in the drawing by the magnetic attraction (see FIG. 2B2).

Next, FIG. 2C1 shows cross-sectional schematic views of the curvature control mechanism 20 at the moment of applying a combination of currents that is different from that in FIG. 2B1 to the electromagnets 22a and 22b. FIG. 2C2 shows cross-sectional schematic views of the curvature control mechanism 20 in a state where a change in shape converges after a certain period from the application of the currents. FIGS. 2C1 and 2C2 are each the cross-sectional views taken along dashed-dotted lines C-D and E-F in FIG. 2A. Furthermore, the dash-dotted line C-D passes through the magnetic poles on one side of the electromagnets and the dash-dotted line E-F passes through the magnetic poles on the other side.

The directions of the magnetic poles on one and the other sides of one electromagnet 22 are the same as those of an adjacent electromagnet 22 as a result of the application of currents in the same direction to the electromagnets 22a and 22b. Therefore, magnetic repulsion is generated between two adjacent electromagnets 22 (see FIG. 2C1). Since the electromagnets 22 are fixed to the substrate 21, the substrate 21 curves downward in the drawing by the magnetic repulsion (see FIG. 2C2).

As described above, the curvature of the substrate 21 can be controlled by adjusting the strength of the magnetic poles generated in the electromagnets 22. Furthermore, the curvature can be changed by changing the interval between two adjacent electromagnets 22.

Moreover, the curvature can be changed also by the elasticity of the substrate 21. Here, the setting of the height of the elasticity of the substrate 21 to an appropriate value is necessary for the following reasons. The elasticity of the substrate 21 is preferably high to the extent that the display device 10 keeps a flat state when a current is not applied to the electromagnets 22. Moreover, the elasticity of the substrate 21 is preferably low to the extent that the display device 10 curves to a desired degree when a current is applied to the electromagnets 22.

The substrate 21 preferably has restoring force so that the substrate 21 returns to the flat state from a curved state when the application of the current to the electromagnets 22 is stopped.

Furthermore, the elasticity of the insulating film 23 is preferably high because the force against magnetic attraction or magnetic repulsion between the electromagnets 22 is generated by the insulating film 23 filling the space between two adjacent electromagnets 22.

Note that arrangement of the electromagnets 22 and the wirings 26a and 26b is not limited to the structure in FIG. 1B. As shown in FIG. 3A, the wirings 26a may be provided collectively on one side of the curvature control mechanism 20 and the wirings 26b may be provided collectively on the other side of the curvature control mechanism 20.

Figure 3B:
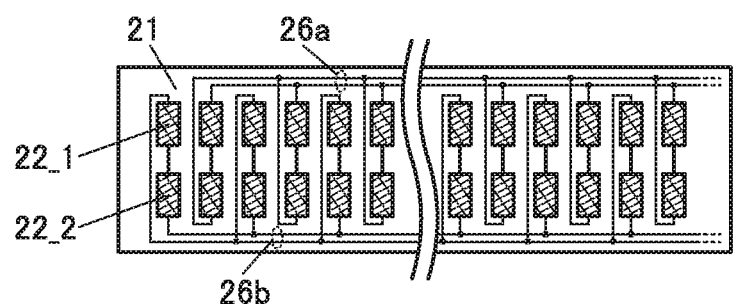

Furthermore, as shown in FIG. 3B, the length in the direction of the center axis of the electromagnet 22 may be shortened, and a plurality of electromagnets 22 (two electromagnets 22 in the example illustrated in FIG. 3A) may be arranged in the short-side direction of the curvature control mechanism 20. Such a structure allows magnetic attraction or magnetic repulsion generated in the electromagnets 22 to be distributed more uniformly in the curvature control mechanism 20.

In FIG. 3B, electromagnets 22_1 and electromagnets 22_2, which are adjacent to each other in the short-side direction of the curvature control mechanism 20, are electrically connected to each other by one of the wiring 26a and the wiring 26b. Furthermore, the line connecting the magnetic poles on one side of the electromagnets 22_1 and the line connecting the magnetic poles on the other side of the electromagnets 22_1 are provided to be parallel to the extended axis of the curvature control mechanism 20. Similarly, the line connecting the magnetic poles on one side of the electromagnets 22_2 and the line connecting the magnetic poles on the other side of the electromagnets 22_2 are provided to be parallel to the extended axis of the curvature control mechanism 20. Note that the length in the direction of the center axis of the electromagnets 22_1 and 22_2 is shorter than that of the electromagnet 22.

Figure 3C:
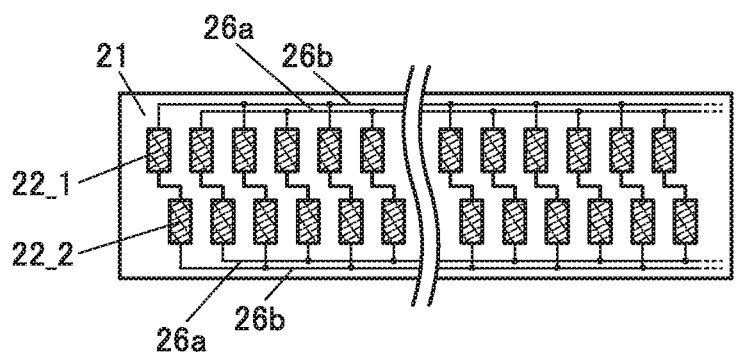

Moreover, although the center axes of the electromagnets 22_1 and 22_2 match each other in FIG. 3B, these do not necessarily match each other. For example, as shown in FIG. 3C, the electromagnets 22_1 and 22_2 may be provided so that the center axis of the electromagnet 22_2 passes through the midpoint of the line segment representing the distance between center axes of two adjacent electromagnets 22_1. Such a structure allows magnetic attraction or magnetic repulsion generated in the electromagnet 22 to be distributed more uniformly in the curvature control mechanism 20.

As described above, the curvature of the display device 10 or the substrate 21 can be controlled by applying a predetermined current to the electromagnets 22 included in the curvature control mechanism 20.

Structure Example 2 of Display Device

A structure of a display device of one embodiment of the present invention partly different from that of the display device 10 will be described below. The description of the display device 10 can be referred to for structures which are similar to those of the display device 10 and which are included in a display device 30 in this structural example.

FIG. 4A is a top view of the display device 30. The display device 30 includes the substrate 21, the display portion 55, and curvature control mechanisms 40. The display portion 55 has a function of displaying an image. The display portion 55 includes a display element like a liquid crystal element, an EL element, or an electrophoretic element, for example.

The display portion 55 is provided over a first surface of the substrate 21. The curvature control mechanisms 40 are provided in regions on the first surface side and the second surface side of the substrate 21 not overlapping with the display portion 55 of the display device 30. The curvature control mechanisms 40 are provided, for example, in a vicinity of an end portion of the display device 30 so as to extend along a long side of the display device 30. FIG. 4A shows an example where the two curvature control mechanisms 40 are provided between the display portion 55 and two sides of the display device 30. Note that the curvature control mechanisms 40 may overlap with the display portion 55.

FIG. 4B1 shows an enlarged top view of components of the curvature control mechanism 40. Only components provided on the first surface side of the substrate 21 are shown in FIG. 4B1. Furthermore, FIG. 4B2 shows an enlarged bottom view of components of the curvature control mechanism 40. Only components provided on the second surface side of the substrate 21 are shown in FIG. 4B2. Unlike FIG. 1B, FIGS. 4B1 and 4B2 illustrate the electromagnets 22 provided on the first and second surface sides of the substrate 21, so that the controllability of the curvature of the curvature control mechanisms 40 can be improved. Moreover, the curvature control mechanisms 40 are different from the curvature control mechanisms 20 in having magnetic shield layers 24.

Furthermore, the wiring 26a, the wiring 26b, a wiring 26c, and a wiring 26d are electrically connected to a power source. The power source has a function of outputting a current to the wirings 26a, 26b, 26c, and 26d after determining the amount and the direction of the current for each of the wirings. The power source may be provided inside or outside the display device 30. Note that the amount of the current applied to the wirings 26a, 26b, 26c, and 26d may be the same. Furthermore, the direction of the current applied to one of the wirings 26a and 26b and that of the current applied to one of the wirings 26c and 26d may be the same.

FIG. 4C is a cross-sectional view taken along dashed-dotted line A-B in FIGS. 4B1 and 4B2. The magnetic shield layers 24 and the electromagnets 22 are provided in this order over the first surface of the substrate 21, and the insulating film 23 is provided over the substrate 21, the magnetic shield layers 24, and the electromagnets 22. Moreover, the magnetic shield layers 24 and the electromagnets 22 are provided in this order also over the second surface of the substrate 21, and the insulating film 23 is provided so as to cover the substrate 21, the magnetic shield layers 24, and the electromagnets 22.

The electromagnets 22 are fixed to the substrate 21 with the magnetic shield layers 24 interposed therebetween. Furthermore, the insulating film 23 is in close contact with the substrate 21 and the electromagnets 22, and the insulating film 23 fills a region between two adjacent electromagnets 22 entirely. The insulating film 23 functions as a protective film of the substrate 21 and the electromagnets 22.

The magnetic shield layers 24 are provided so that the edges thereof are provided on the outer side than the electromagnets 22 in the top view or the bottom view. Since the curvature control mechanisms 40 include the magnetic shield layers 24, generation of magnetic attraction or magnetic repulsion between the electromagnets 22 on the first surface side and the electromagnets 22 on the second surface side of the substrate 21 can be prevented. Therefore, separation of the electromagnets 22 from the substrate 21 can be prevented, so that the reliability of the display device 30 can be improved.

As the magnetic shield layers 24, the magnetic material described above can be favorably used.

Driving Method Example 2 of Curvature Control Mechanism

Next, a driving method of the curvature control mechanism 40 is described. In the curvature control mechanism 40 in FIG. 5A, the electromagnet electrically connected to the wiring 26a is referred to as the electromagnet 22a and the electromagnet electrically connected to the wiring 26b is referred to as the electromagnet 22b. Although not illustrated, the electromagnet electrically connected to the wiring 26c is referred to as the electromagnet 22c and the electromagnet electrically connected to the wiring 26d is referred to as the electromagnet 22d. In this driving method example, the electromagnet 22 means all of the electromagnets 22a to 22d.

FIG. 5B1 shows cross-sectional schematic views of the curvature control mechanism 40 at the moment of the application of a current to the electromagnets 22a, 22b, 22c, and 22d. FIG. 5B2 shows cross-sectional schematic views of the curvature control mechanism 40 in a state where a change in shape converges after a certain period from the application of the current. FIGS. 5B1 and 5B2 are each the cross-sectional views taken along dashed-dotted lines C-D and E-F in FIG. 5A. Furthermore, the dash-dotted line C-D passes through the magnetic poles on one side of the electromagnets 22 and the dash-dotted line E-F passes through the magnetic poles on the other side of the electromagnets 22.

The directions of the magnetic poles on one and the other sides of the electromagnet 22a are opposite from those of the adjacent electromagnet 22b as a result of the application of currents in the reverse directions to the electromagnets 22a and 22b. Therefore, magnetic attraction is generated between two adjacent electromagnets 22 on the first surface side of the substrate 21. Furthermore, the directions of the magnetic poles on one and the other sides of the electromagnet 22c are the same as those of the adjacent electromagnet 22d as a result of the application of currents in the same direction to the electromagnets 22c and 22d. Therefore, magnetic repulsion is generated between two adjacent electromagnets 22 on the second surface side of the substrate 21 (see FIG. 5B1). Since the electromagnets 22 are fixed to the substrate 21 with the magnetic shield layers 24 interposed therebetween, the substrate 21 curves upward in the drawing by the magnetic attraction and the magnetic repulsion (see FIG. 5B2).

Next, FIG. 6A1 shows cross-sectional schematic views of the curvature control mechanism 40 at the moment of applying a combination of currents that is different from that in FIG. 5B1 to the electromagnets 22a, 22b, 22c, and 22d. FIG. 6A2 shows cross-sectional schematic views of the curvature control mechanism 40 in a state where a change in shape converges after a certain period from the application of the currents. FIGS. 6A1 and 6A2 are each the cross-sectional views taken along dashed-dotted lines C-D and E-F in FIG. 5A. Furthermore, the dash-dotted line C-D passes through the magnetic poles on one side of the electromagnets 22 and the dash-dotted line E-F passes through the magnetic poles on the other side of the electromagnets 22.

The directions of the magnetic poles on one and the other sides of the electromagnet 22a are the same as those of the adjacent electromagnet 22b as a result of the application of currents in the same direction to the electromagnets 22a and 22b. Therefore, magnetic repulsion is generated between two adjacent electromagnets 22 on the first surface side of the substrate 21. Furthermore, the directions of the magnetic poles on one and the other sides of the electromagnet 22c are opposite from those of the adjacent electromagnet 22d as a result of the application of currents in the reverse directions to the electromagnets 22c and 22d. Therefore, magnetic attraction is generated between two adjacent electromagnets 22 on the second surface side of the substrate 21 (see FIG. 6A1). The substrate 21 curves downward in the drawing by the magnetic attraction and the magnetic repulsion (see FIG. 6A2).

Next, FIG. 6B1 shows cross-sectional schematic views of the curvature control mechanism 40 at the moment of applying a combination of currents that is different from those in FIGS. 5B1 and 6A1 to the electromagnets 22a, 22b, 22c, and 22d. FIG. 6B2 shows cross-sectional schematic views of the curvature control mechanism 40 in a state where a change in shape converges after a certain period from the application of the currents. FIGS. 6B1 and 6B2 are each the cross-sectional views taken along dashed-dotted lines C-D and E-F in FIG. 5A. Furthermore, the dash-dotted line C-D passes through the magnetic poles on one side of the electromagnets 22 and the dash-dotted line E-F passes through the magnetic poles on the other side of the electromagnets 22. Note that the curvature control mechanism 40 in FIG. 6B1 is not flat before the current application.

The directions of the magnetic poles on one and the other sides of the electromagnet 22a are the same as those of the adjacent electromagnet 22b as a result of the application of currents in the same direction to the electromagnets 22a and 22b. Therefore, magnetic repulsion is generated between two adjacent electromagnets 22 on the first surface side of the substrate 21. Furthermore, the directions of the magnetic poles on one and the other sides of the electromagnet 22c are the same as those of the adjacent electromagnet 22d as a result of the application of currents in the same direction to the electromagnets 22c and 22d. Therefore, magnetic repulsion is generated between two adjacent electromagnets 22 on the second surface side of the substrate 21. When the substrate 21 is not flat, the distance between two electromagnets 22 varies depending on the positions of electromagnets 22 over the substrate 21, and magnetic repulsion between two electromagnets 22 also varies in accordance with the distance (see FIG. 6B1). The substrate 21 becomes flat by the magnetic repulsion between two electromagnets 22 on the first surface side and the magnetic repulsion between two electromagnets 22 on the second surface side (see FIG. 6B2).

As described above, the curvature of the display device 30 or the substrate 21 can be controlled by applying a predetermined current to the electromagnets 22 included in the curvature control mechanism 40.

At least part of this embodiment can be implemented in combination with any of the other embodiments described in this specification as appropriate.

Embodiment 2

In this embodiment, a structure of a display device of one embodiment of the present invention is described with reference to FIGS. 7A to 7C, FIG. 8, FIGS. 9A, 9B1, and 9B2, and FIGS. 10A1 and 10A2. Note that the description of the display device 10 in Embodiment 1 can be referred to for structures which are similar to those of the display device 10 and which are included in a display device 70 in this structural example.

Structure Example of Display Device

Figure 7A:
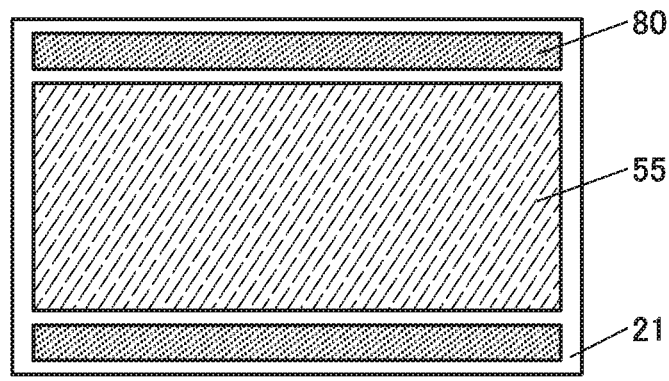
FIGS. 7A to 7C illustrate a structure of a display device of an embodiment.

FIG. 7A is a top view of the display device 70. The display device 70 includes the substrate 21, the display portion 55, and curvature control mechanisms 80. The display portion 55 has a function of displaying an image.

The display portion 55 is provided over the first surface of the substrate 21. The curvature control mechanisms 80 are provided in regions on the first surface side and the second surface side of the substrate 21 not overlapping with the display portion 55 of the display device 70. The curvature control mechanisms 80 are provided, for example, in a vicinity of an end portion of the display device 70 so as to extend along a long side of the display device 70. FIG. 7A shows an example where the two curvature control mechanisms 80 are provided between the display portion 55 and two sides of the display device 70. Note that the curvature control mechanisms 80 may overlap with the display portion 55.

Figure 7B:
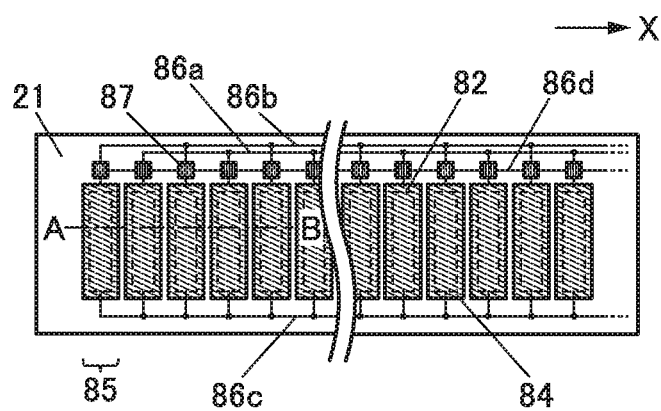

FIG. 7B shows an enlarged top view of components of the curvature control mechanism 80. Furthermore, FIG. 7C is a cross-sectional view taken along dashed-dotted line A-B in FIG. 7B.

The curvature control mechanism 80 includes electromagnets 85, a wiring 86a, a wiring 86b, a wiring 86c, a wiring 86d, and transistors 87 (see FIG. 7B). The curvature control mechanism 80 can be referred to as a circuit board. Furthermore, the curvature control mechanism 80 is included in a circuit board. Moreover, the curvature control mechanism 80 can also be referred to as a semiconductor device. That is, the display device 70 includes a semiconductor device.

Figure 7C:
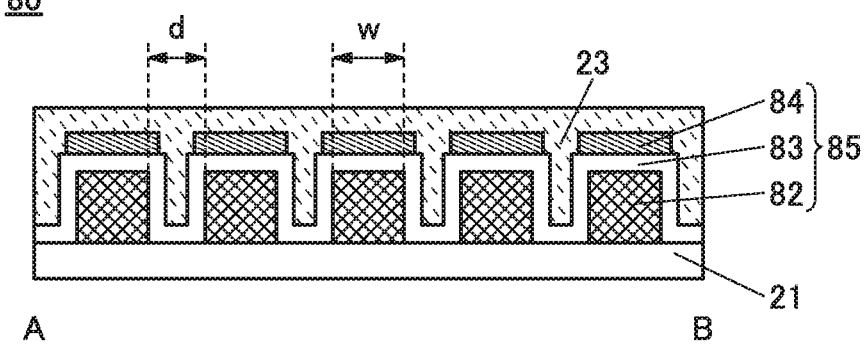

The electromagnets 85 each include a magnetic material 82, an insulating film 83, and an electrode 84 (see FIG. 7C). The magnetic material 82 is electrically connected to the wiring 86c (see FIG. 7B). The electrode 84 is electrically connected to the wiring 86a or 86b through the transistor 87. Moreover, the transistor 87 is electrically connected to the wiring 86d.

As shown in FIG. 7C, the electromagnets 85 are provided over the first surface of the substrate 21, and an insulating film 23 is provided over the substrate 21 and the electromagnets 85. The electromagnets 85 are fixed to the substrate 21. Furthermore, the insulating film 23 is in close contact with the substrate 21 and the electromagnets 85, and the insulating film 23 and the insulating film 83 fill a region between two adjacent electromagnets 85 entirely. The insulating film 23 functions as a protective film of the substrate 21 and the electromagnets 85.

The electromagnets 85 each have a structure where the magnetic material 82 and the electrode 84 face each other with the insulating film 83 interposed therebetween (see FIG. 7C). When a voltage is applied to the wirings electrically connected to the magnetic material 82 and the electrode 84, a magnetic field appears in the stacking direction of the magnetic material 82, the insulating film 83, and the electrode 84. Specifically, magnetic poles appear in the vicinity of the top surface and the bottom surface of the magnetic material 82 when the voltage is applied to the electromagnet 85. One magnetic pole becomes one of the north pole and the south pole and the other magnetic pole becomes the other thereof depending on the voltage applied.

Furthermore, the strength of the magnetic poles can be controlled in some cases depending on the voltage applied. The electromagnets 85 can be referred to as voltage-control-type electromagnets.

As shown in FIG. 7B, the electromagnets 85 are provided over the substrate 21 so that in the top view long sides of the electromagnets 85 and a line parallel to the longitudinal direction of the curvature control mechanism 80 (the X direction in FIG. 7B) cross each other perpendicularly. Furthermore, the electromagnets 85 are provided so that long sides are parallel with each other and short sides of the electromagnets 85 in the top view are parallel to the long side of the curvature control mechanism 80.

Among the magnetic poles generated in the magnetic material 82, the magnetic pole generated in a region between two surfaces of the adjacent magnetic materials 82 which face each other is used for controlling the curvature, so that the distance d between two adjacent magnetic materials 82 is preferably short (see FIG. 7C). Furthermore, the length w in the short-side direction in the top view of the electromagnet 85 is preferably small so that a larger number of electromagnets 85 can be provided over the curvature control mechanism 80.

Note that FIG. 7B shows an example where the electromagnets 85 are provided at regular intervals. With such a structure, the curvature of the display device 70 or the substrate 21 controlled by the curvature control mechanism 80 can be uniform. Furthermore, the curvature of the display device 70 or the substrate 21 in a specific region can be larger (or smaller) than the other regions by providing a plurality of electromagnets 85 in the specific region at short (or long) intervals.

As the magnetic material 82, a metal magnetic material such as cobalt or nickel can be used. In particular, cobalt is preferably used. Furthermore, the magnetic material described in Embodiment 1 may be used. Note that a protective insulating film may be provided over the magnetic material 82. Moreover, a conductive base film may be provided between the magnetic material 82 and the substrate 21.

As the insulating film 83, hafnium oxide can be used. Alternatively, silicon oxide, silicon oxynitride, silicon nitride oxide, silicon nitride, aluminum oxide, or the like may be used.

The electrode 84 can be formed using a metal material such as gold, chromium, silver, aluminum, copper, titanium, tantalum, tungsten, or the like. Furthermore, a single layer using one of these materials or a stacked layer using two or more of these materials may be used.

The description in Embodiment 1 can be referred to for the substrate 21 and the insulating film 23.

Circuit Structure Example of Curvature Control Mechanism

Figure 8:
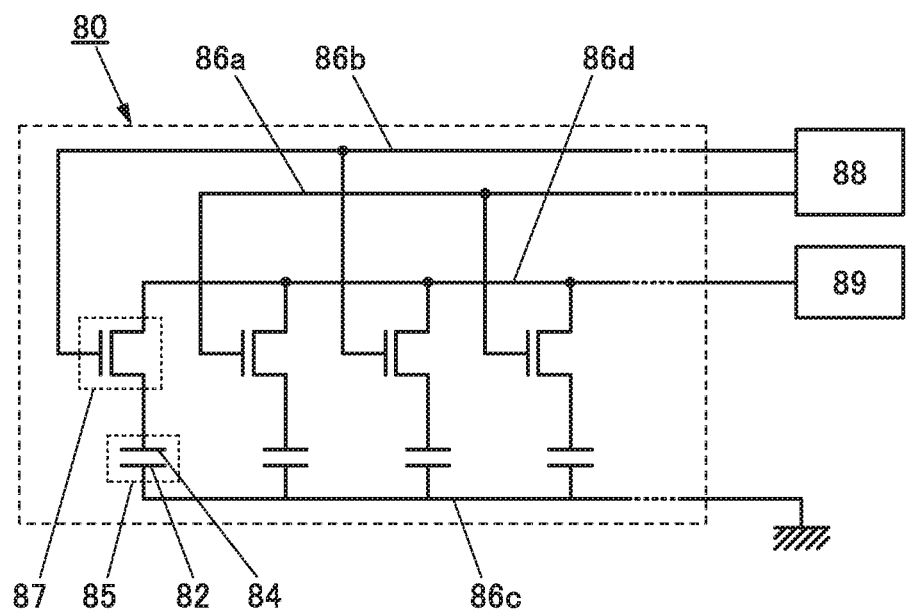
FIG. 8 illustrates a circuit configuration of a curvature control mechanism of an embodiment.

Next, FIG. 8 shows an example of the curvature control mechanism 80 and a circuit which controls the operation thereof.

The electrode 84 is electrically connected to one of a source and a drain of the transistor 87. The other thereof is electrically connected to the wiring 86d. The gate of the transistor 87 is electrically connected to one of the wirings 86a and 86b. Specifically, the transistor 87 which is adjacent to the transistor 87 electrically connected to the wiring 86a is electrically connected to the wiring 86b.

The wirings 86a and 86b are electrically connected to a switch circuit 88. The wiring 86d is electrically connected to a power source 89. Furthermore, the magnetic material 82 is electrically connected to the wiring 86c. A fixed voltage such as a ground voltage or a common voltage is supplied to the wiring 86c.

The switch circuit 88 has a function of supplying a voltage to the wirings 86a and 86b individually. That is, control of on/off states of the transistor 87 electrically connected to the wiring 86a and the transistor 87 electrically connected to the wiring 86b can be performed individually by the switch circuit 88.

The power source 89 has a function of supplying an arbitrary voltage to the wiring 86d.

The power source 89 supplies an arbitrary voltage to the wiring 86d while the switch circuit 88 selects the transistor 87 electrically connected to the wiring 86a or the wiring 86b, so that a predetermined voltage can be applied to the electrode 84 included in the electromagnet 85 electrically connected to the transistor.

After the application of the predetermined voltage to the electrode 84, the voltage applied to the electrode 84 is held by turning off the transistor 87. Therefore, the switch circuit 88 and the power source 89 are not necessarily driven while the curvature of the display device 70 does not change, so that the power consumption of the display device 70 can be reduced. Note that if the voltage of the electrode 84 is reduced by generation of leakage current, refresh operation may be performed every predetermined period while the curvature of the display device 70 does not change.

As the transistor 87, a transistor in which a channel region is formed in an oxide semiconductor is preferably used. A transistor using an oxide semiconductor has a small off-state current, so that the voltage of the electrode 84 can be held for a long period by using such a transistor as the transistor 87. In other words, power consumption of the display device 70 can be sufficiently reduced because refresh operation is unnecessary or the frequency of refresh operation is extremely low.

As the above oxide semiconductor, at least indium or zinc is preferably included, and in particular, indium and zinc are preferably included. Furthermore, in addition to these, aluminum, gallium, yttrium, tin, or the like is preferably included. As the oxide semiconductor, metal oxides such as In—Ga—Zn oxide (also referred to as IGZO), In—Ga oxide, and In—Zn oxide can be given, for example.

Note that FIG. 8 shows an example where the switch circuit 88 and the power source 89 are provided outside the curvature control mechanism 80. The switch circuit 88 and the power source 89 may be provided inside or outside the display device 70.

Furthermore, the structure of the wirings 86a and 86b electrically connected to the transistor 87 is not limited to that in FIG. 8. Three or more wirings may be electrically connected to different transistors 87 so that the switch circuit 88 can supply a voltage to those wirings individually.

Driving Method Example of Curvature Control Mechanism

Next, a driving method of the curvature control mechanism 80 is described. In the curvature control mechanism 80 in FIG. 9A, the electromagnet electrically connected to the wiring 86a is referred to as the electromagnet 85a and the electromagnet electrically connected to the wiring 86b is referred to as the electromagnet 85b. In this driving method example, the electromagnet 85 means both the electromagnets 85a and 85b.

FIG. 9B1 shows a cross-sectional schematic view of the curvature control mechanism 80 at the moment of the application of a voltage to the electromagnets 85a and 85b. FIG. 9B2 shows a cross-sectional schematic view of the curvature control mechanism 80 in a state where a change in shape converges after a certain period from the application of the voltage. FIG. 9B1 is the cross-sectional view taken along dashed-dotted line C-D in FIG. 9A.

The directions of the magnetic poles on one and the other sides of one electromagnet 85 are opposite from those of an adjacent electromagnet 85 as a result of the application of a predetermined positive voltage to one of the electromagnet 85a and 85b and a predetermined negative voltage to the other thereof. Therefore, magnetic attraction is generated between two adjacent electromagnets 85 (see FIG. 9B1). Since the electromagnets 85 are fixed to the substrate 21, the substrate 21 curves upward in the drawing by the magnetic attraction (see FIG. 9B2). Note that, in the magnetic material 82 in FIG. 9B1, a magnetic pole generated in a region surrounded with a circle of a broken line is one of the north pole and the south pole, and a magnetic pole generated in a region surrounded with a square of a broken line is the other thereof.

Next, FIG. 10A1 shows a cross-sectional schematic view of the curvature control mechanism 80 at the moment of applying a combination of voltages that is different from that in FIG. 9B1 to the electromagnets 85a and 85b. FIG. 10A2 shows a cross-sectional schematic view of the curvature control mechanism 80 in a state where a change in shape converges after a certain period from the application of the voltages. FIG. 10A1 is the cross-sectional view taken along dashed-dotted line C-D in FIG. 9A.

The directions of the magnetic poles on one and the other sides of one electromagnet 85 are the same as those of an adjacent electromagnet 85 as a result of the application of a predetermined positive voltage or a predetermined negative voltage to the electromagnets 85a and 85b. Therefore, magnetic repulsion is generated between the two adjacent electromagnets 85 (see FIG. 10A1). The substrate 21 curves downward in the drawing by the magnetic repulsion (see FIG. 10A2).

As described above, the curvature of the display device 70 or the substrate 21 can be controlled by applying a predetermined voltage to the electromagnets 85 included in the curvature control mechanism 80 in some cases.

Note that in this embodiment, although a structure where the electromagnets 85 or the wirings are provided only over the first surface of the substrate 21, the structure of the present invention is not limited to this. The electromagnets 85 or the wirings may be provided on both the first surface side and the second surface side of the substrate 21.

At least part of this embodiment can be implemented in combination with any of the other embodiments described in this specification as appropriate.

Embodiment 3

In this embodiment, an electronic device including the display device of one embodiment of the present invention will be described with reference to FIG. 11 and FIGS. 12A to 12E.

Structural Example of Electronic Device

Figure 11:
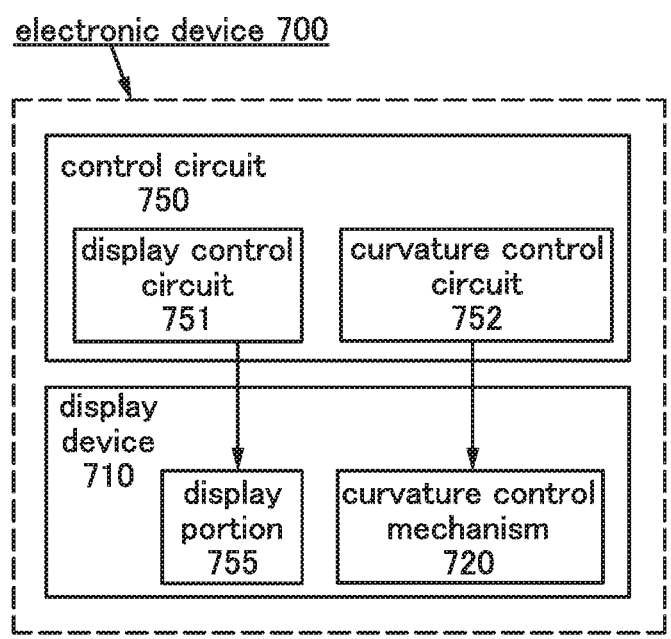
FIG. 11 illustrates a structure of an electronic device of an embodiment.

FIG. 11 is a block diagram illustrating an example of the main structure of an electronic device 700. In FIG. 11, the directions of arrows represent the directions of signal transmission.

The electronic device 700 includes a display device 710 and a control circuit 750. The display device 710 includes a display portion 755 and a curvature control mechanism 720. The control circuit 750 includes a display control circuit 751 and a curvature control circuit 752.

The display portion 755 has a function of displaying an image, and the display control circuit 751 has a function of controlling image display of the display portion 755.

The curvature control mechanism 720 has a function of controlling the curvature of the display device 710. The curvature control circuit 752 has a function of controlling the operation of the curvature control mechanism 720. That is, it can be said that the curvature control circuit 752 has a function of controlling the curvature of the display device 710.

Figure 12A:
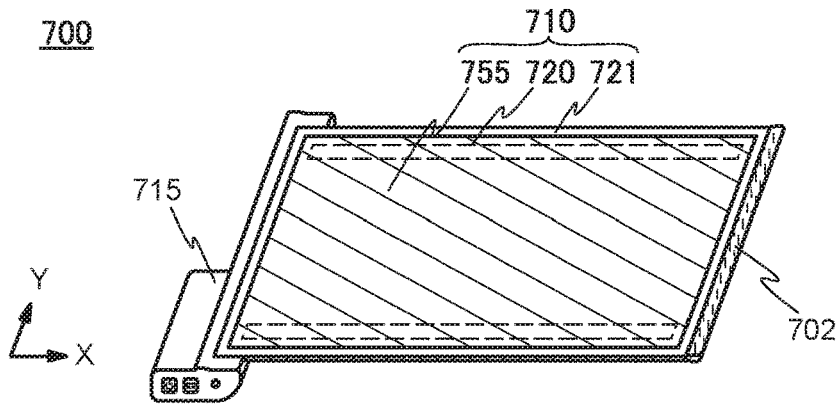
FIGS. 12A to 12E illustrate a specific structure example of the electronic device of an embodiment.
Figure 12B:
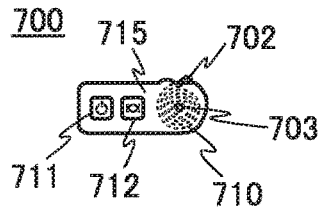
Figure 12C:
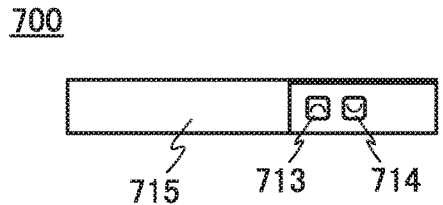
Figure 12D:
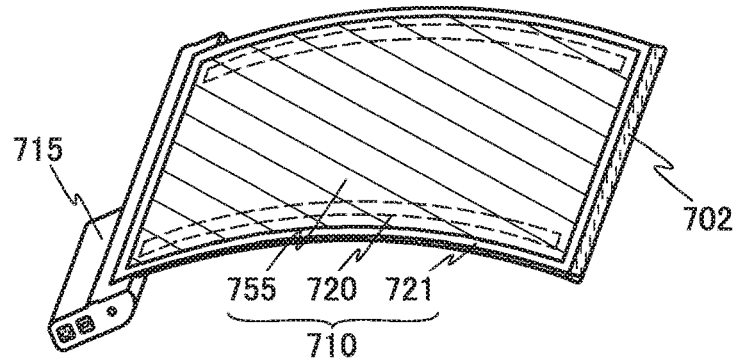
Figure 12E:
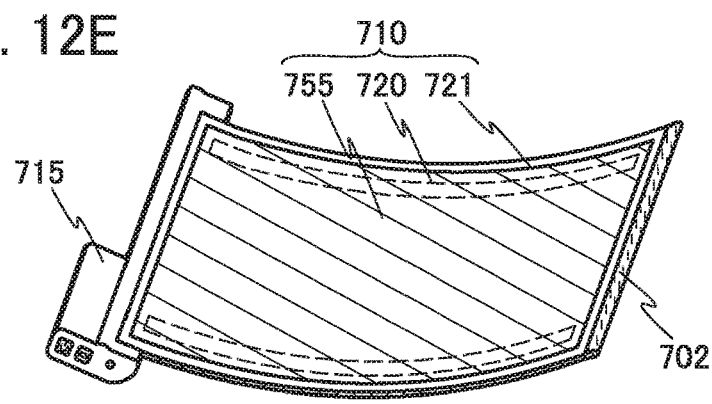

FIGS. 12A to 12E are specific structure examples of the electronic device 700. FIG. 12A is a perspective view of the electronic device 700. FIG. 12B is a front view of the electronic device 700 seen from the Y direction in FIG. 12A when the display device is stored in a housing. FIG. 12C is a side view of the electronic device 700 seen from the X direction in FIG. 12A. Furthermore, FIGS. 12D and 12E are each a perspective view of the display device 710 kept at a predetermined curvature by the curvature control mechanism included in the electronic device 700.

The electronic device 700 includes the display device 710, the control circuit 750 (not illustrated), a housing 715, and a display device pull 702 (see FIG. 12A). The display device 710 includes the curvature control mechanism 720, a substrate 721, and the display portion 755. The control circuit 750 includes the display control circuit 751 and the curvature control circuit 752. The housing 715 includes the control circuit 750 inside. Furthermore, the electronic device 700 includes a power button 711, a power button 712, a button 713, and a button 714 on the side surface of the housing 715 (see FIGS. 12B and 12C).

Note that the structure of the display device 10 or a display device 30 described in Embodiment 1 or a display device 70 described in Embodiment 2 can be referred to for the structure of the display device 710 except the following points. That is, the display device 710 is different from the display device 10, the display device 30, or the display device 70 in that the curvature control mechanism 720 and the display portion 755 overlap with each other. With such a structure, the area occupied by the display portion 755 in the display device 710 can be increased. In other words, the width of the frame of the display device 710 can be decreased. The description of the curvature control mechanism 20, the curvature control mechanism 40, or the curvature control mechanism 80 can be referred to for the structure of the curvature control mechanism 720. The description of the substrate 21 and the display portion 55 can be referred to for the structure of the substrate 721 and the display portion 755, respectively.

FIG. 12A shows the electronic device 700 when a large part of the display device 710 is pulled out from the housing 715 and the display device 710 hardly curves. The display device 710 can be taken up by a rod 703 and stored in the housing 715 by rotating the rod 703 provided inside the housing 715 (see FIG. 12B). The operation of the rod 703 (performing rotation and stopping the rotation) can be carried out manually with a handle connected to the rod 703 outside the housing 715 or by pulling the display device pull 702 with a spring, a notch, or the like inside the housing 715. Furthermore, a button for controlling the operation of the rod 703 with an electric signal may be provided outside the housing 715. In this case, the structure where a motor connected to the rod 703 is provided inside the housing 715 and the motor is controlled with the button may be used.

The power button 711 has a function of turning on and off the display portion 755.

The power button 712 has a function of turning on and off the curvature control circuit 752. Furthermore, the buttons 713 and 714 have a function of controlling the curvature control circuit 752. Specifically, the buttons 713 and 714 have a function of adjusting a current or a voltage (hereinafter, also referred to as a curvature control value) applied to electromagnets included in the curvature control mechanism 720.

For example, the display device 710 can be convex upward, that is, in the direction in which the display portion 755 displays (see FIG. 12D) by pressing the button 713. For the control method of electromagnets in this case, the description of FIG. 2C1 or FIG. 6A1 in Embodiment 1 or FIG. 10A1 in Embodiment 2 can be referred to. Furthermore, the display device 710 can be concave upward (see FIG. 12E) by pressing the button 714. For the control method of electromagnets in this case, the description of FIG. 2B1 or FIG. 5B1 in Embodiment 1 or FIG. 9B1 in Embodiment 2 can be referred to.

Note that the display device 710 preferably includes a touch panel. By controlling the display operation of the display portion 755 with the touch panel, the structure where the housing 715 does not include a button or the like for the control can be used, so that components such as a button provided on the surface of the housing 715 can be reduced. In the case where the electronic device 700 is operated with the housing 715 grasped by one hand, operation by the hand which grasps the housing 715 can be performed easily because of the small number of buttons or the like on the surface of the housing 715. Furthermore, by the display device 710 including a touch panel, the touch panel can be operated by the hand which does not grasp the housing 715, so that the usability of the electronic device 700 can be improved. Note that in the case where the display device 710 does not include a touch panel, a button for controlling the display operation of the display portion 755 may be provided on the surface of the housing 715.

Furthermore, the curvature control circuit 752 preferably has a function of retaining a curvature control value. With such a structure, the curvature of the display device 710 which a user felt preferable after the adjustment with the buttons 713 and 714 can be reproduced just after the curvature control circuit 752 is turned on.

Figure 13A:
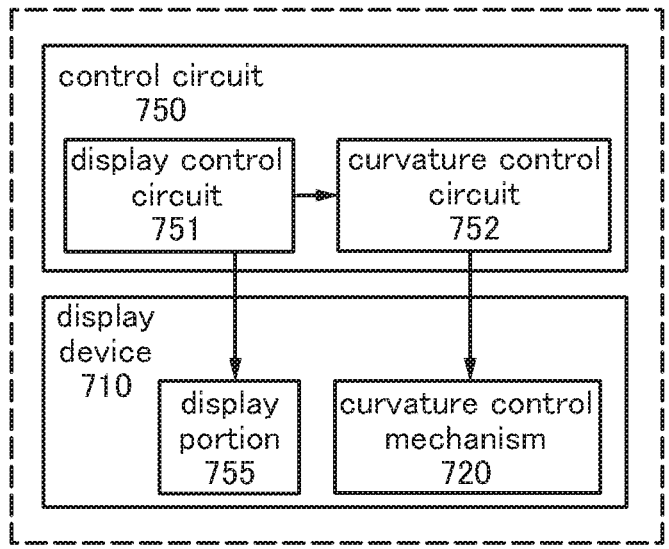
FIGS. 13A and 13B illustrate structures of the electronic device of an embodiment.

Note that the display control circuit 751 may have a function of controlling the operation of the curvature control circuit 752 (see FIG. 13A). For example, image data displayed on the display portion 755 includes a curvature control value and the curvature control value is outputted to the curvature control circuit 752, so that the curvature of the display device 710 can be changed in accordance with the contents of the displayed image. Furthermore, the curvature of the display device can be changed in conjunction with the operation of the electronic device 700 related to the display operation of the display portion 755. Therefore, the electronic device which can display an image with enhanced realism can be provided.

Figure 13B:
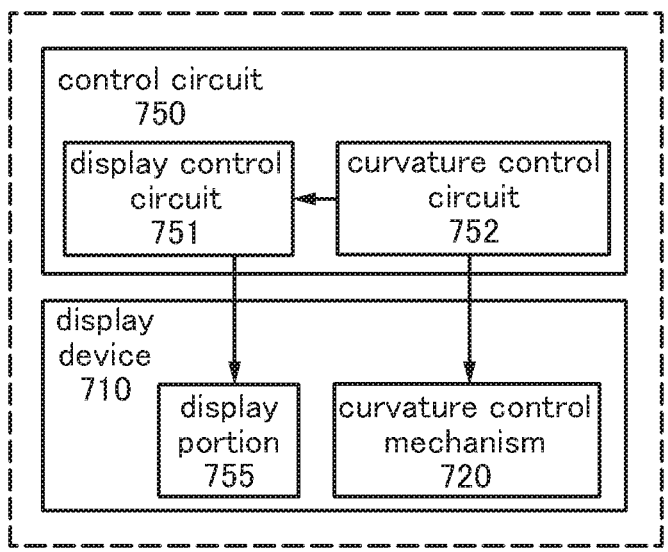

Furthermore, the curvature control circuit 752 may have a function of controlling the operation of the display control circuit 751 (see FIG. 13B). With such a structure, change of the curvature of the display device 710 can be used for controlling the image displayed on the display portion 755.

At least part of this embodiment can be implemented in combination with any of the other embodiments described in this specification as appropriate.

Embodiment 4

In this embodiment, a display system including a display device of one embodiment of the present invention is described with reference to FIG. 14, FIGS. 15A to 15C, FIG. 16, FIG. 17, FIG. 18, FIGS. 19A and 19B, FIGS. 20A to 20E, and FIG. 21.

Structure Example 1 of Display System

Figure 14:
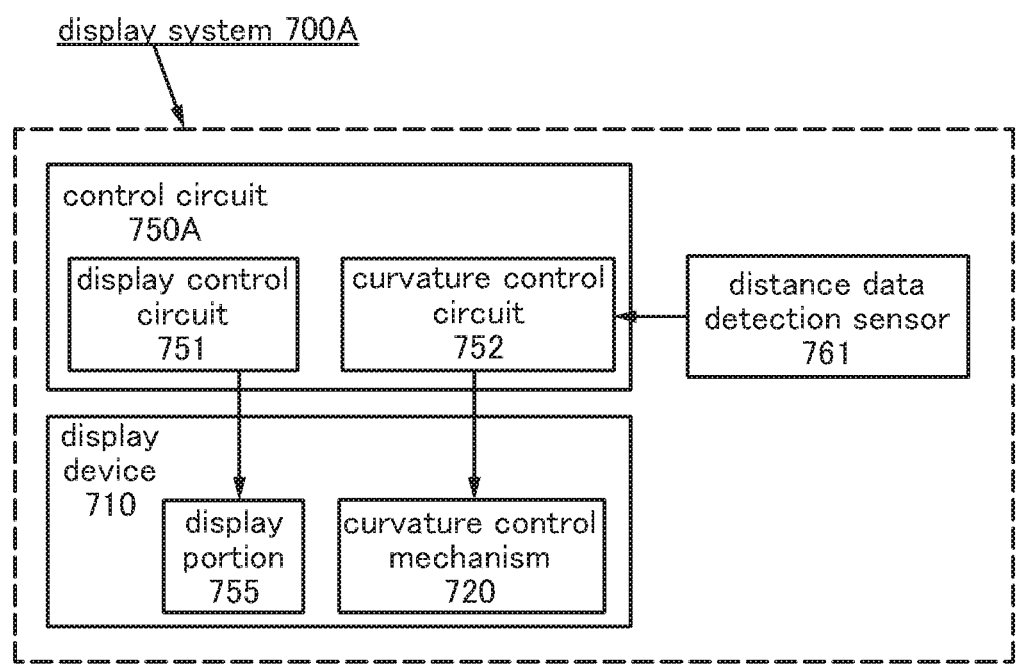
FIG. 14 illustrates a structure of a display system of an embodiment.

FIG. 14 is a block diagram illustrating an example of the main configuration of a display system 700A of one embodiment of the present invention. In FIG. 14, the directions of arrows represent the directions of signal transmission.

The display system 700A includes the display device 710, the control circuit 750A, and a distance data detection sensor 761. The display device 710 includes the display portion 755 and the curvature control mechanism 720. The control circuit 750A includes the display control circuit 751 and the curvature control circuit 752.

The display portion 755 has a function of displaying an image, and the display control circuit 751 has a function of controlling image display of the display portion 755.

The curvature control mechanism 720 has a function of controlling the curvature of the display device 710. The curvature control circuit 752 has a function of controlling the operation of the curvature control mechanism 720. That is, it can be said that the curvature control circuit 752 has a function of controlling the curvature of the display device 710.

By the way, the stereoscopic effect or the realistic sensation of the image displayed on the display portion 755 which a user feels may be enhanced by changing the curvature of the display device 710. For example, when the display portion 755 has a convexly curved surface on the side where the display portion 755 displays an image (the user side), the stereoscopic effect and/or the depth of the displayed image may be enhanced. Furthermore, when the display portion 755 has a concavely curved surface on the side where the display portion 755 displays an image, the realistic sensation of the displayed image may be enhanced.

Furthermore, the degree of the enhancement of the stereoscopic effect or the realistic sensation which a user feels may change in accordance with the distance between the user and the display portion 755 and the curvature of the display device 710. For example, when the display portion 755 has a concavely curved surface, it can be considered that the realistic sensation of the displayed image is further enhanced by increasing the curvature of the display device 710 as a user comes closer to the display portion 755.

The distance data detection sensor 761 included in the display system 700A of one embodiment of the present invention has a function of detecting the distance data between a user and the distance data detection sensor 761 and outputting the distance data to the curvature control circuit 752. The curvature control circuit 752 controls the operation of the curvature control mechanism 720 on the basis of the distance data so that a user can feel the curvature of the display device 710 preferable. With this structure, the display system with the improved usability in controlling the curvature of the display device can be provided.

Figure 15A:
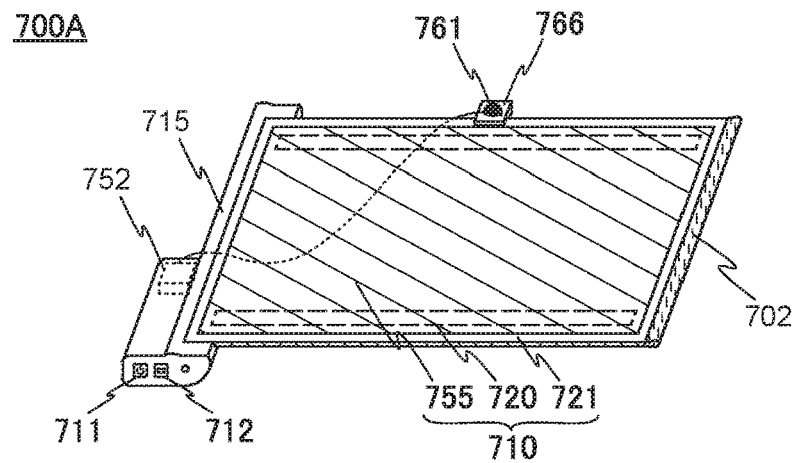
FIGS. 15A to 15C illustrate specific structure examples of the display system of an embodiment.

FIG. 15A is a perspective view of a specific structure example of the display system 700A. Note that in FIG. 15A, the description in Embodiment 2 can be referred to for components denoted by the same reference numerals as those of the electronic device 700 described in Embodiment 2 with reference to FIGS. 12A and 12B. Hereinafter, components of the display system 700A which are different from those of the electronic device 700 are mainly described.

The display system 700A includes the display device 710, the control circuit 750A, the housing 715, the distance data detection sensor 761, and the display device pull 702. The display device 710 includes the curvature control mechanisms 720, the substrate 721, and the display portion 755. The control circuit 750A includes the display control circuit 751 and the curvature control circuit 752. The housing 715 includes the control circuit 750 inside. Furthermore, the display system 700A includes the power buttons 711 and 712 on the side surface of the housing 715.

The distance data detection sensor 761 is provided over a clip 766 and electrically connected to the curvature control circuit 752 through a cable. The clip 766 can be attached to the display device 710 detachably. The clip 766 preferably has flexibility in order not to interfere the curve of the display device 710. Specifically, the clip 766 is preferably flexible along the curve of the display device 710. Furthermore, it is preferable that the distance data detection sensor 761, the curvature control circuit 752, and the cable can be stored in the housing 715.

Figure 15B:
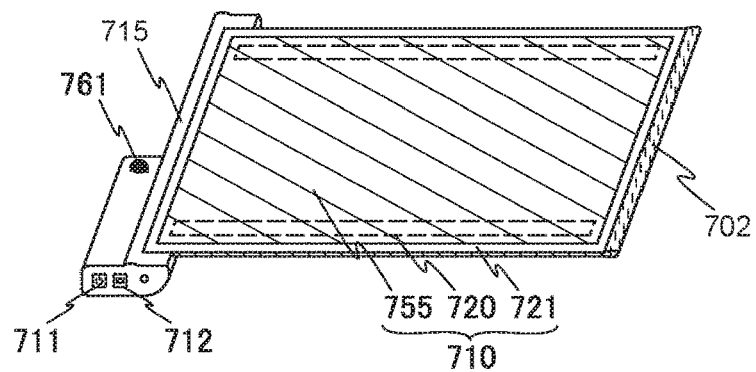
Figure 15C:
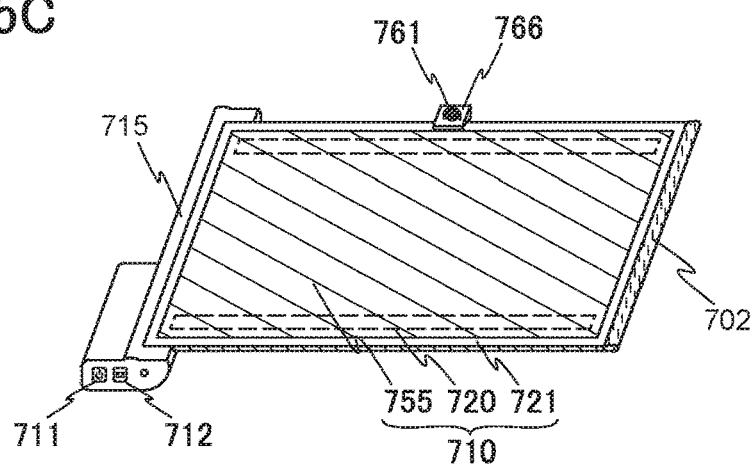

The clip 766 is attached to the center of the top (see FIG. 15A) or the bottom of the display device 710 in order not to overlap the display portion 755. Accordingly, even when the display device 710 is curved, the state where a user is approximately in front of the distance data detection sensor 761 can be maintained. Note that although the structure in FIG. 15A is particularly effective when the directivity of the distance data detection sensor 761 is high (the object detection range is narrow), the structure is not limited to this when the distance data detection sensor 761 can detect the distance from an object over a wide range. For example, as illustrated in FIG. 15B, the distance data detection sensor 761 may be provided over the surface of the housing 715.

Furthermore, with the structure where the direction of the distance data detection sensor 761 does not change regardless of the change of the curvature of the display device 710 in use, the distance data detection sensor 761 with high directivity can be provided over the housing 715. For example, the housing 715 may have a movable portion with a rotation axis between the distance data detection sensor 761 and the storage portion of the display device 710. By using such a structure and rotating the movable portion in accordance with the change of the curvature of the display device 710, a user can keep using the display device 710 without changing the direction of grasping the housing 715.

The distance data detection sensor 761 can transmit a signal relating to the distance data between a user and the distance data detection sensor 761 to the curvature control circuit 752. Although an example where the distance data detection sensor 761 and the curvature control circuit 752 are electrically connected to each other through a cable or the like is shown in FIG. 15A, the structure is not limited to this. Signal transmission/reception may be performed between the distance data detection sensor 761 and the curvature control circuit 752 by wireless communication (see FIG. 15C). Note that the display system 700A may have a circuit which performs a predetermined computation on the signal relating to the distance data and transmits the computation result to the curvature control circuit 752.

As the distance data detection sensor 761, an element which senses infrared rays, ultrasonic waves, microwaves, visible rays, or the like can be used. For example, an infrared ray sensor or an ultrasonic wave sensor can be used as the distance data detection sensor 761.

Note that the display system 700A may include the buttons 713 and 714 described in Embodiment 3. Furthermore, the display system 700A may have a mode-switching button. The mode-switching button has a function of selecting a first mode or a second mode as a method for controlling the curvature of the display device 710, that is, controlling the curvature control circuit 752. In the first mode, the curvature control circuit 752 is controlled with the buttons 713 and 714. In the second mode, the curvature control circuit 752 is controlled with the distance data detection sensor 761.

Figure 16:
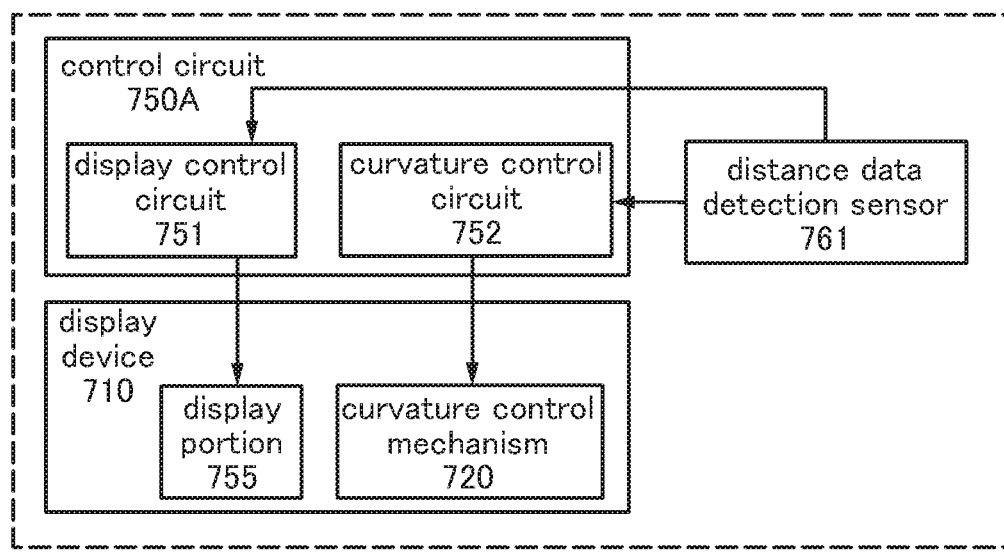
FIG. 16 illustrates a structure of the display system of an embodiment.

Furthermore, the distance data detection sensor 761 may have a function of outputting the distance data to the display control circuit 751 (see FIG. 16). With this structure, an image displayed on the display portion 755 can be controlled in accordance with user's position or motion. For example, when the distance between a user and the distance data detection sensor 761 is shortened by user's motion such as looking into a displayed image, the display control circuit 751 operates in order to enlarge the displayed image, so that the realistic sensation of the image that the user feels can be further enhanced.

Curvature Control Method 1 of Display Device

Here, how the display system 700A illustrated in FIG. 15A controls the curvature of the display device 710 is described with reference to FIG. 17. The controlling method includes four steps below.

First, the distance data detection sensor 761 obtains distance data (hereinafter, also referred to as m-th distance data (m is an integer of one or more)) (see step S01 in FIG. 17).

Next, the comparison between the m-th distance data and previous distance data obtained by the distance data detection sensor 761 (hereinafter, also referred to as m−1-th distance data) is performed (see step S02 in FIG. 17). The m−1-th distance data is retained in the curvature control circuit 752. Furthermore, the computation for the comparison is performed in the curvature control circuit 752.

Figure 17:
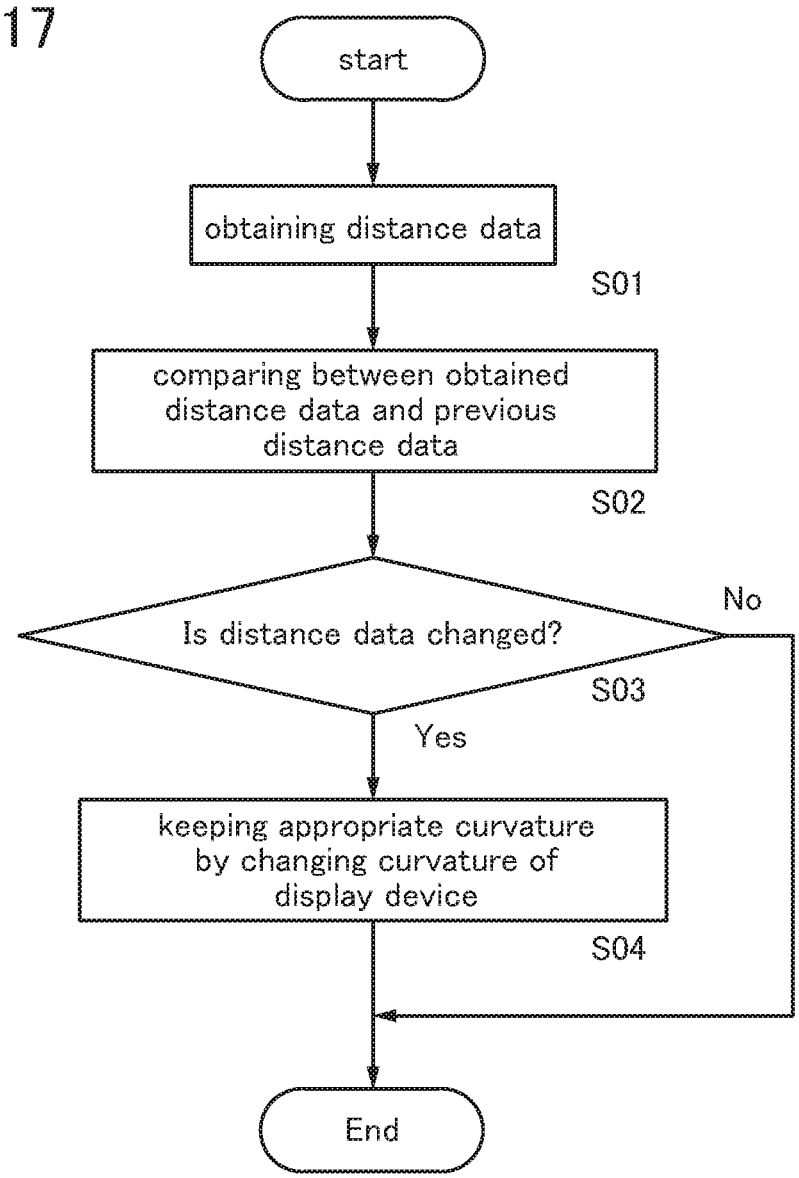
FIG. 17 shows a method for controlling the curvature of the display system of an embodiment.

When the m-th distance data and the m−1-th distance data are different, that is, when the m-th distance data changes from the m−1-th distance data, the curvature control circuit 752 controls the operation of the curvature control mechanism 720 on the basis of the change of the distance data so that the display device 710 can have an appropriate curvature (see steps S03 and S04 in FIG. 17).

When the m-th distance data and the m−1-th distance data are the same, the curvature control circuit 752 controls the operation of the curvature control mechanism 720 so that the curvature of the display device 710 will not change. Then, the m-th distance data is retained in the curvature control circuit 752. The m−1-th distance data may be overwritten by the m-th distance data or retained separately from the m-th distance data.

The above steps S01 to S04 are performed at a predetermined frequency, so that the display system 700A can adjust the curvature of the display device 710 following the positional change of a user (mainly user's head).

Note that the curvature control circuit 752 may control the curvature by setting a corresponding table of given distance data (distance between a user and the distance data detection sensor 761) and the curvature of the display device 710 in advance, and comparing the distance data obtained by the distance data detection sensor 761 to the corresponding table. In this case, the curvature control circuit 752 need not retain the distance data.

Structure Example 2 of Display System

Figure 18:
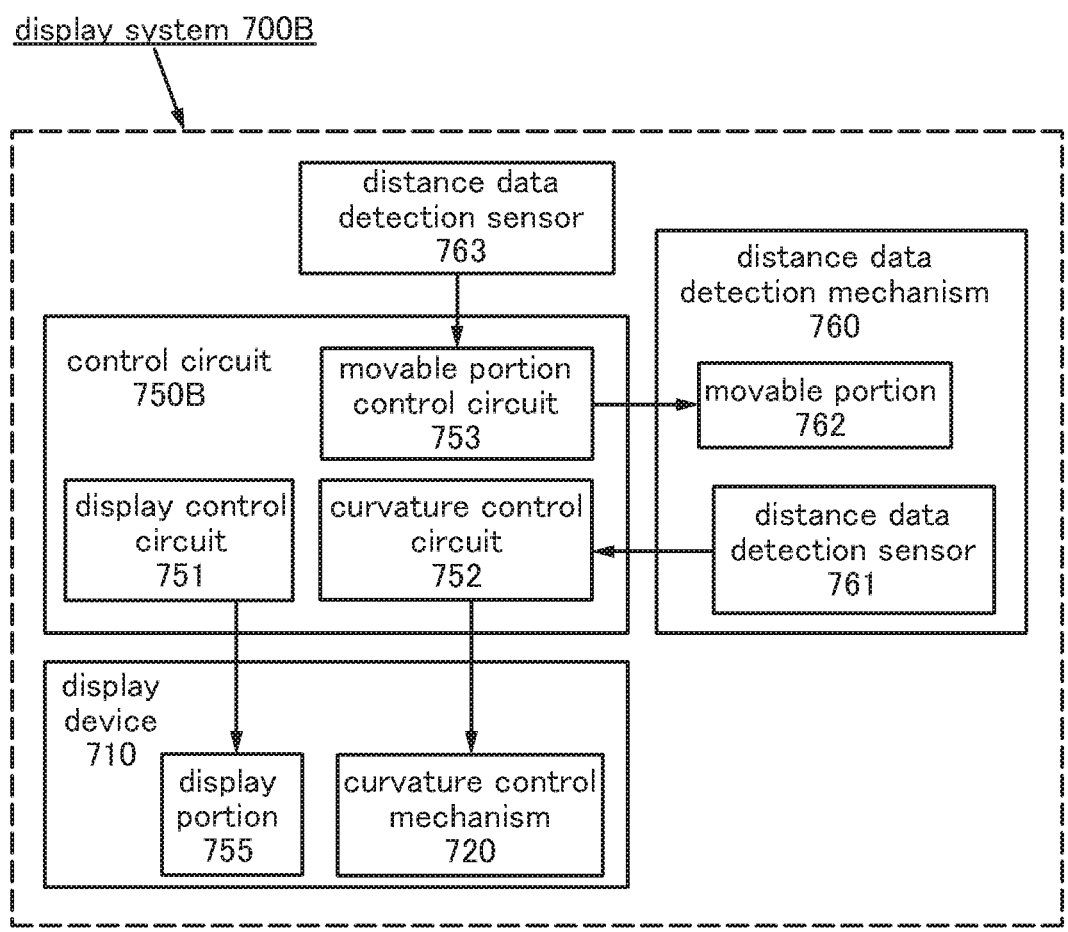
FIG. 18 illustrates a structure of a display system of an embodiment.

FIG. 18 is a block diagram illustrating an example of the main configuration of a display system 700B of one embodiment of the present invention. In FIG. 18, the directions of arrows represent the directions of signal transmission.

The display system 700B includes the display device 710, a control circuit 750B, a distance data detection mechanism 760, and a positional data detection sensor 763. The display device 710 includes the display portion 755 and the curvature control mechanism 720. The control circuit 750B includes the display control circuit 751, the curvature control circuit 752, and a movable portion control circuit 753. The distance data detection mechanism 760 includes the distance data detection sensor 761 and a movable portion 762.

The display portion 755 has a function of displaying an image, and the display control circuit 751 has a function of controlling image display of the display portion 755.

The curvature control mechanism 720 has a function of controlling the curvature of the display device 710. The curvature control circuit 752 has a function of controlling the operation of the curvature control mechanism 720. That is, it can be said that the curvature control circuit 752 has a function of controlling the curvature of the display device 710.

The distance data detection sensor 761 has a function of detecting the distance data between a user and the distance data detection sensor 761 and outputting the distance data to the curvature control circuit 752. The curvature control circuit 752 can control the operation of the curvature control mechanism 720 on the basis of the distance data so that a user can feel the curvature of the display device 710 preferable.

By the way, during the use of the electronic device 700 described in Embodiment 2 or the display system 700A described in this embodiment, when the curvature of the display device 710 changes, it is preferable to rotate the housing 715 in accordance with the change.

Figure 19A:
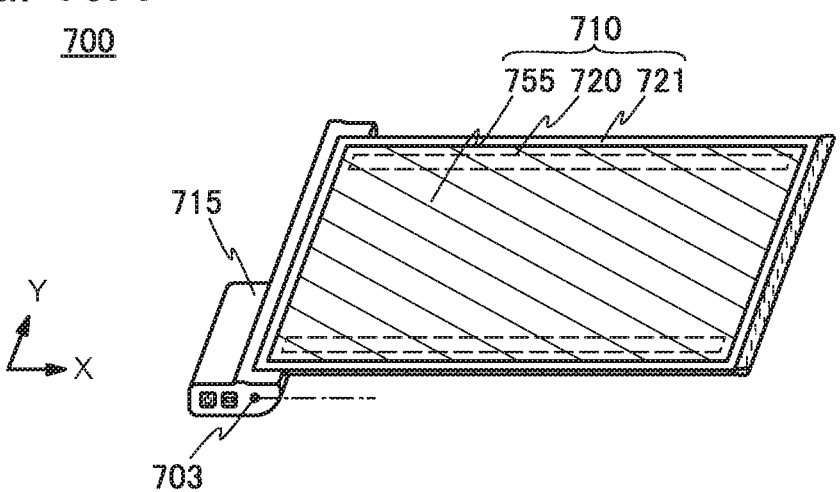
FIGS. 19A and 19B illustrate a specific structure example of the display system of an embodiment.
Figure 19B:
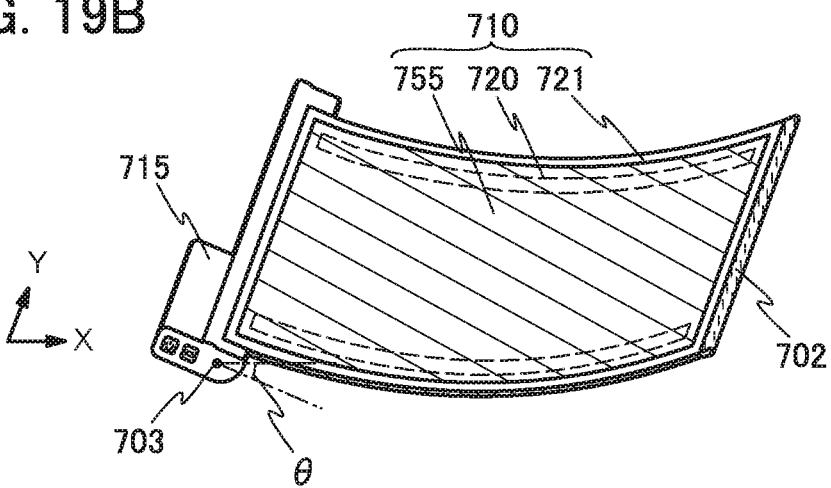

For example, when the display device 710 changes from the almost flat state to the state having a curvature with a concavely curved surface on the user side, the use of the display device 710 can be continued while user's eyes are kept on the display portion 755 by rotating the housing 715 only an angle θ about an axis parallel in the Y direction (the extending direction of the rod 703) (see FIGS. 19A and 19B). FIGS. 19A and 19B are cross-sectional views of the electronic device 700 in the state where the display device 710 is almost flat and the state where the display device 710 has a curvature with a concavely curved surface on the user side, respectively. Furthermore, a dash-dotted line in FIG. 19A is parallel to the top surface of the housing 715 in the state of FIG. 19A, and two dash-dotted lines in FIG. 19B are lines parallel to the top surface of the housing 715 in the state of FIGS. 19A and 19B. The angle θ is an angle between the two dash-dotted lines in FIG. 19B.

For example, when the distance data detection sensor 761 is provided over the surface of the housing 715 as shown in FIG. 15B, a user may be out of the object detection range of the distance data detection sensor 761 in use by rotating the housing 715 as above. Therefore, when the distance data detection sensor 761 with high directivity is provided over the housing 715, the structure where the detection range of the distance data detection sensor 761 changes so that a user can be sensed even when the housing 715 rotates is necessarily used.

The distance data detection sensor 761 included in the display system 700B of one embodiment of the present invention can change the detection range of the distance data detection sensor 761 by being connected to the movable portion 762. Furthermore, when the movable portion control circuit 753 controls the movable portion 762 on the basis of the positional data of a user obtained by the positional data detection sensor 763, the detection range can be changed so that the user is in the detection range. With this structure, the display system with the improved usability in controlling the curvature of the display device can be provided.

The signal transmission in FIG. 18 is described below. The positional data detection sensor 763 can detect the positional data of a user and output the positional data to the movable portion control circuit 753. The movable portion control circuit 753 controls operation of the movable portion 762 on the basis of the positional data so that a user is in the detection range of the distance data detection sensor 761. The distance data detection sensor 761 transmits a signal relating to the distance data between a user and the distance data detection sensor 761 to the curvature control circuit 752. The curvature control circuit 752 controls the curvature control mechanism 720 on the basis of the distance data so that a user can feel the curvature of the display device 710 preferable.

Figure 20A:
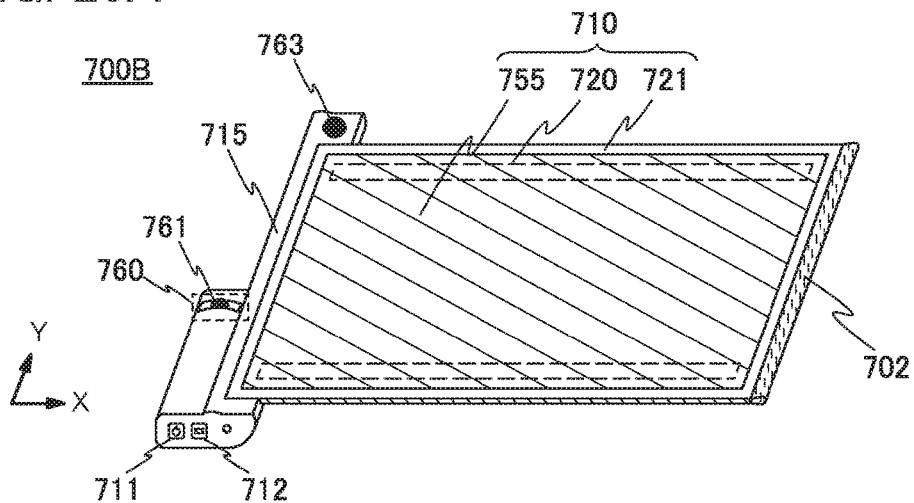
FIGS. 20A to 20E illustrate a specific structure example of the display system of an embodiment.

FIG. 20A is a perspective view of a specific structure example of the display system 700B. Note that in FIG. 20A, the description in Embodiment 2 can be referred to for components denoted by the same reference numerals as those of the electronic device 700 described in Embodiment 2 with reference to FIGS. 12A and 12B. Hereinafter, components of the display system 700B which are different from those of the electronic device 700 are mainly described.

The display system 700B includes the display device 710, the control circuit 750B, the housing 715, the distance data detection mechanism 760, the positional data detection sensor 763, and the display device pull 702. The display device 710 includes the curvature control mechanisms 720, the substrate 721, and the display portion 755. The control circuit 750B includes the display control circuit 751, the curvature control circuit 752, and the movable portion control circuit 753. The housing 715 includes the control circuit 750B inside. The distance data detection mechanism 760 includes the distance data detection sensor 761 and the movable portion 762 (not illustrated). Furthermore, the display system 700B includes the power buttons 711 and 712 on the side surface of the housing 715.

The positional data detection sensor 763 is provided over the housing 715. The distance data detection sensor 761 is provided over the movable portion 762 and the movable portion 762 is provided over the housing 715 so that the direction of the distance data detection sensor 761 can be changed.

For example, the movable portion 762 has a mechanism capable of rotating about the rod as an axis. The detection range of the distance data detection sensor 761 can be changed by rotating the rod. Note that it is preferable that the rotating direction of the rod match with the rotating direction of the housing 715 (the rotating direction of Y axis in FIG. 20A) when the display system 700B is used. An example where the curvature control mechanism 720 included in the display system 700B which includes such a movable portion 762 is driven so that the display device 710 is kept at a predetermined curvature is shown in FIGS. 20B and 20C.

Figure 20B:
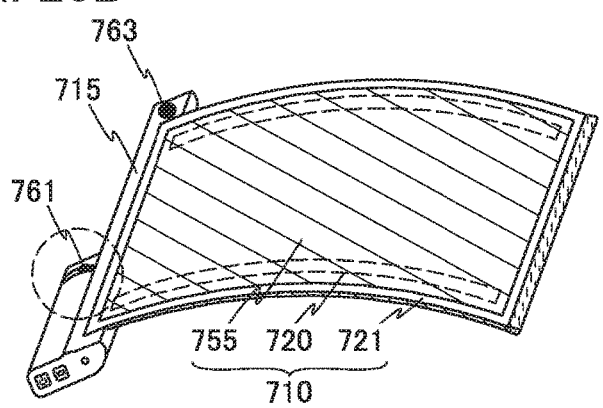
Figure 20C:
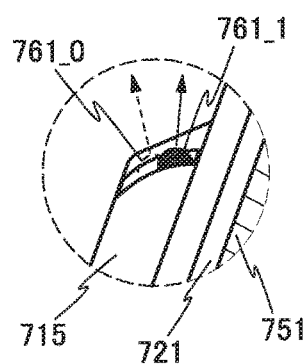

FIG. 20B is a perspective view of the display system 700B in which the display device 710 is kept at a curvature so as to be convex in the direction in which the display device 710 displays. Furthermore, FIG. 20C is an enlarged view of a portion surrounded with a circle of a broken line in FIG. 20B. When the curvature of the display system 700B changes from the state in FIG. 20A to that in FIG. 20B while a user's head keeps in front of the vicinity of the center of the display portion 755, the movable portion 762 operates so that the position of the distance data detection sensor 761 changes from a position of a sensor 761_0 to a position of a sensor 761_1 (see FIG. 20C). Therefore, the state where the user is approximately in front of the distance data detection sensor 761 can be maintained. Note that the position of the sensor 7610 matches that of the distance data detection sensor 761 in FIG. 20A. Furthermore, in FIG. 20C, a dashed arrow and a solid arrow indicate the directions of the center of the detection range of the sensor 761_0 and the sensor 761_1, respectively.

Figure 20D:
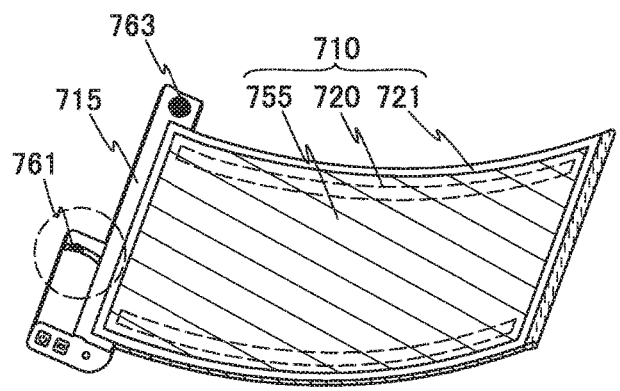
Figure 20E:
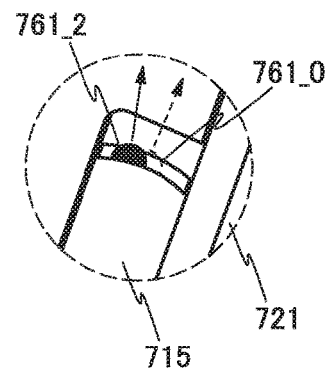

FIG. 20D is a perspective view of the display system 700B in which the display device 710 is kept at a curvature so as to be concave in the direction in which the display device 710 displays. Furthermore, FIG. 20E is an enlarged view of a portion surrounded with a circle of a broken line in FIG. 20D. When the curvature of the display system 700B changes from the state in FIG. 20A to that in FIG. 20D while a user's head keeps in front of the vicinity of the center of the display portion 755, the movable portion 762 operates so that the position of the distance data detection sensor 761 changes from the position of the sensor 761_0 to a position of a sensor 761_2 (see FIG. 20E). Therefore, the state where the user is approximately in front of the distance data detection sensor 761 can be maintained. The position of the sensor 761_0 matches that of the distance data detection sensor 761 in FIG. 20A. Furthermore, in FIG. 20E, a dashed arrow and a solid arrow indicate the directions of the center of the detection range of the sensor 761_0 and the sensor 761_2, respectively.

Note that the movable portion 762 may have two mechanisms capable of rotating about the rod and may be rotatable in the rotating direction of Y axis and the rotating direction of X axis. In the case where the movable portion 762 is rotatable in the rotating direction of X axis, when the relative position between a user of the display system 700B and the distance data detection sensor 761 changes in the Y direction, for example, when the housing 715 changes its direction so as to incline backward or forward, the direction of the distance data detection sensor 761 can be changed following the positional change of the user.

As the positional data detection sensor 763, an element which senses visible rays such as a CCD sensor or a CMOS sensor can be used.

As the distance data detection sensor 761, an element which senses infrared rays, ultrasonic waves, microwaves, visible rays, or the like can be used. For example, an infrared ray sensor or an ultrasonic wave sensor can be used as the distance data detection sensor 761.

Note that the display system 700B may include the buttons 713 and 714 described in Embodiment 3. Furthermore, the display system 700B may have a mode-switching button. The mode-switching button has a function of selecting a first mode or a second mode as a method for controlling the curvature of the display device 710, that is, controlling the curvature control circuit 752. In the first mode, the curvature control circuit 752 is controlled with the buttons 713 and 714. In the second mode, the curvature control circuit 752 is controlled with the distance data detection sensor 761.

Curvature Control Method 2 of Display Device

Here, how the display system 700B illustrated in FIG. 20A controls the curvature of the display device 710 is described with reference to FIG. 21. The controlling method includes eight steps below.

First, the positional data detection sensor 763 obtains the positional data (hereinafter, also referred to as n-th positional data (n is an integer of one or more)) (see step S11 in FIG. 21).

Next, the comparison between the n-th positional data and previous positional data obtained by the positional data detection sensor 763 (hereinafter, also referred to as n–1-th positional data) is performed (see step S12 in FIG. 21). The n–1-th positional data is retained in the movable portion control circuit 753. Furthermore, the computation for the comparison is performed in the movable portion control circuit 753.

Figure 21:
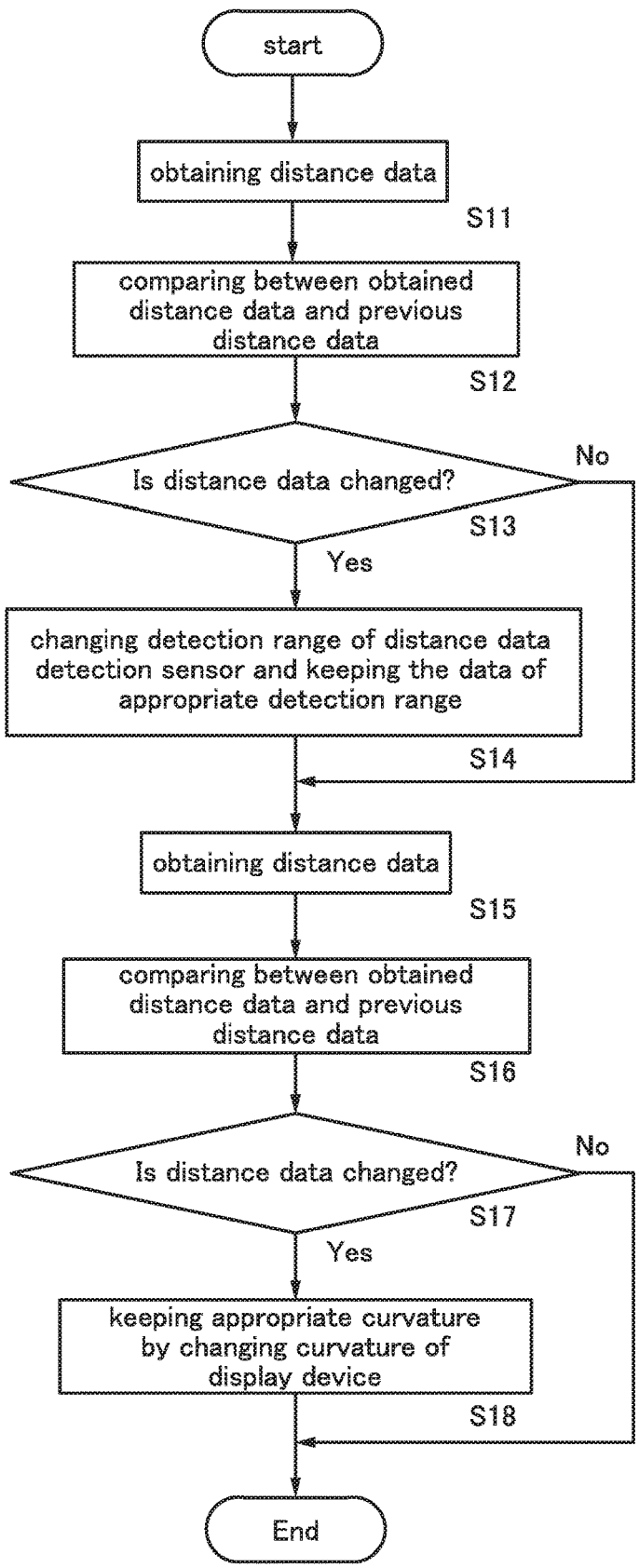
FIG. 21 shows a method for controlling the curvature of the display system of an embodiment.

When the n-th positional data and the n–1-th positional data are different, that is, when the n-th positional data changes from the n–1-th positional data, the movable portion control circuit 753 controls the operation of the movable portion 762 on the basis of the change of the positional data so that a user is in the detection range of the distance data detection sensor 761 (see steps S13 and S14 in FIG. 21).

When the n-th positional data and the n–1-th positional data are the same, the movable portion control circuit 753 controls the operation of the movable portion control circuit 753 so that the detection range of the distance data detection sensor 761 will not change. Then, the n-th positional data is retained in the movable portion control circuit 753. The n–1-th positional data may be overwritten by the n-th positional data or retained separately from the n-th positional data.

Next, the distance data detection sensor 761 obtains the distance data (hereinafter, also referred to as n-th distance data.) (see step S15 in FIG. 21).

Next, the comparison between the n-th distance data and previous distance data obtained by the distance data detection sensor 761 (hereinafter, also referred to as n–1-th distance data) is performed (see step S16 in FIG. 21). The n–1-th distance data is retained in the curvature control circuit 752. Furthermore, the computation for the comparison is performed in the curvature control circuit 752.

When the n-th distance data and the n–1-th distance data are different, that is, when the n-th distance data changes from the n–1-th distance data, the curvature control circuit 752 controls the operation of the curvature control mechanism 720 on the basis of the change of the distance data so that the display device 710 can have an appropriate curvature (see steps S17 and S18 in FIG. 21).

When the n-th distance data and the n–1-th distance data are the same, the curvature control circuit 752 controls the operation of the curvature control mechanism 720 so that the curvature of the display device 710 will not change. Then, the n-th distance data is retained in the curvature control circuit 752. The n–1-th distance data may be overwritten by the n-th distance data or retained separately from the n-th distance data.

The above steps S11 to S18 are performed at a predetermined frequency, so that the display system 700B can adjust the curvature of the display device 710 following the positional change of a user (mainly user's head).

Note that the curvature control circuit 752 may control the curvature by setting a corresponding table of given distance data (distance between a user and the distance data detection sensor 761) and the curvature of the display device 710 in advance, and comparing the distance data obtained by the distance data detection sensor 761 to the corresponding table. In this case, the curvature control circuit 752 need not retain the distance data.

Similarly, the movable portion control circuit 753 may control the curvature by setting a corresponding table of given positional data and the position of the movable portion 762 (or the direction of the distance data detection sensor 761) in advance, and comparing the positional data obtained by the positional data detection sensor 763 to the corresponding table. In this case, the movable portion control circuit 753 need not retain the positional data.

At least part of this embodiment can be implemented in combination with any of the other embodiments described in this specification as appropriate.

This application is substrated on Japanese Patent Application serial no. 2015-194752 filed with Japan Patent Office on Sep. 30, 2015 and Japanese Patent Application serial no. 2016-016118 filed with Japan Patent Office on Jan. 29, 2016, the entire contents of which are hereby incorporated by reference.

What is claimed is:

1. A display system comprising:
a display device comprising:
a display portion; and
a curvature control mechanism comprising a plurality of electromagnets provided along an end of the display portion, the plurality of electromagnets comprising a first electromagnet, a second electromagnet, and a third electromagnet;
a distance data detection sensor configured to detect a distance data between a user and the distance data detection sensor; and
a curvature control circuit configured to control a curvature of the display device on a basis of the distance data by controlling operation of the curvature control mechanism,
wherein:
the first electromagnet and the second electromagnet are in a first row and are directly adjacent to each other,
a first axis passes through a midpoint of the first electromagnet and a midpoint of the second electromagnet,
the first electromagnet is electrically connected to a first wiring,
the second electromagnet is electrically connected to a second wiring that is different from the first wiring so that a direction of current flowing in the second electromagnet is able to be changed independently of the first electromagnet,
the third electromagnet is in a second row,
a center axis of the third electromagnet passes through a midpoint of a distance between the first electromagnet and the second electromagnet, and
the center axis is orthogonal to the first axis.

2. The display system according to claim 1, wherein the display portion and the curvature control mechanism overlap with each other.

3. The display system according to claim 1, wherein the display portion and the curvature control mechanism do not overlap with each other.

4. The display system according to claim 1, wherein the second electromagnet is configured to be supplied with a current in a same direction as a current flowing in the first electromagnet in a first state and a current in an opposite direction to a current flowing in the first electromagnet in a second state.

5. The display system according to claim 1, wherein the display portion and the curvature control mechanism are provided over one surface of a substrate.

6. The display system according to claim 1, wherein the display device is configured to be changed in shape in accordance with magnetic attraction or magnetic repulsion between the first electromagnet and the second electromagnet.

7. The display system according to claim 1, further comprising a display control circuit configured to control an image to be displayed on the display portion in accordance with the distance data.

8. The display system according to claim 1,
wherein the third electromagnet is electrically connected to the first wiring.

9. The display system according to claim 1, further comprising a housing,
wherein:
the housing comprises the curvature control circuit and a rod, and
the display device is configured to be rolled up with the rod.

10. A display system comprising:
a display device comprising:
a display portion; and
a curvature control mechanism comprising a plurality of electromagnets provided along an end of the display portion, the plurality of electromagnets comprising a first electromagnet, a second electromagnet, and a third electromagnet;
a distance data detection mechanism comprising:
a movable portion; and
a distance data detection sensor provided over the movable portion and configured to detect a distance data between a user and the distance data detection sensor;
a positional data detection sensor configured to detect a positional data of the user; and
a control circuit comprising:
a curvature control circuit configured to control a curvature of the display device on a basis of the distance data by controlling operation of the curvature control mechanism; and
a movable portion control circuit configured to control the movable portion on a basis of the positional data,
wherein:
the first electromagnet and the second electromagnet are in a first row and are directly adjacent to each other,
a first axis passes through a midpoint of the first electromagnet and a midpoint of the second electromagnet,
the first electromagnet is electrically connected to a first wiring;
the second electromagnet is electrically connected to a second wiring that is different from the first wiring so that a direction of current flowing in the second electromagnet is able to be changed independently of the first electromagnet,
the third electromagnet is in a second row,
a center axis of the third electromagnet passes through a midpoint of a distance between the first electromagnet and the second electromagnet, and
the center axis is orthogonal to the first axis.

11. The display system according to claim 10, wherein the display portion and the curvature control mechanism overlap with each other.

12. The display system according to claim 10, wherein the display portion and the curvature control mechanism do not overlap with each other.

13. The display system according to claim 10, wherein the second electromagnet is configured to be supplied with a current in a same direction as a current flowing in the first electromagnet in a first state and a current in an opposite direction to a current flowing in the first electromagnet in a second state.

14. The display system according to claim 10, wherein the display portion and the curvature control mechanism are provided over one surface of a substrate.

15. The display system according to claim 10, wherein the display device is configured to be changed in shape in accordance with magnetic attraction or magnetic repulsion between the first electromagnet and the second electromagnet.

16. The display system according to claim 10,
wherein the third electromagnet is electrically connected to the first wiring.

17. The display system according to claim 10,
wherein:
the movable portion is rotatable,
the positional data detection sensor is configured to be moved in accordance with rotation of the movable portion.

18. The display system according to claim 10, further comprising a housing,
wherein:
the housing comprises the curvature control circuit and a rod, and
the display device is configured to be rolled up with the rod.

* * * * *